United States Patent
Tanaka

(10) Patent No.: US 11,662,386 B2
(45) Date of Patent: May 30, 2023

(54) METHOD FOR INSPECTING SELF-DISCHARGE OF A POWER STORAGE DEVICE AND METHOD FOR PRODUCING THE POWER STORAGE DEVICE

(71) Applicant: Prime Planet Energy & Solutions, Inc., Tokyo (JP)

(72) Inventor: Ruri Tanaka, Toyota (JP)

(73) Assignee: PRIME PLANET ENERGY & SOLUTIONS, INC., Tokyo (JP)

( * ) Notice: Subject to any disclaimer, the term of this patent is extended or adjusted under 35 U.S.C. 154(b) by 0 days.

(21) Appl. No.: 17/523,932

(22) Filed: Nov. 11, 2021

(65) Prior Publication Data

US 2022/0260640 A1 Aug. 18, 2022

(30) Foreign Application Priority Data

Feb. 15, 2021 (JP) .............................. JP2021-021560

(51) Int. Cl.
   *G01R 31/382* (2019.01)
   *G01R 31/392* (2019.01)
   *H01M 10/44* (2006.01)
   *H01M 10/0525* (2010.01)

(52) U.S. Cl.
   CPC ......... *G01R 31/382* (2019.01); *G01R 31/392* (2019.01); *H01M 10/44* (2013.01); *H01M 10/0525* (2013.01)

(58) Field of Classification Search
   None
   See application file for complete search history.

(56) References Cited

U.S. PATENT DOCUMENTS

| | | | |
|---|---|---|---|
| 2011/0236751 A1* | 9/2011 | Amiruddin | H01M 4/0447 429/188 |
| 2017/0153290 A1* | 6/2017 | Sazhin | G01R 31/396 |
| 2019/0011502 A1 | 1/2019 | Kobayashi et al. | |
| 2019/0198942 A1 | 6/2019 | Kobayashi et al. | |
| 2020/0041575 A1 | 2/2020 | Kobayashi et al. | |
| 2020/0243920 A1 | 7/2020 | Yoon et al. | |
| 2021/0296921 A1* | 9/2021 | Lu | H01M 10/44 |

FOREIGN PATENT DOCUMENTS

| | | |
|---|---|---|
| JP | 201916558 A | 1/2019 |
| JP | 2019113450 A | 7/2019 |

* cited by examiner

*Primary Examiner* — Jas A Sanghera
(74) *Attorney, Agent, or Firm* — Hauptman Ham, LLP

(57) ABSTRACT

A method for inspecting self-discharge of a power storage device includes: a) continuously applying a continuous power-supply voltage to the power storage device that has been charged in advance from an external power supply to a first device voltage), the continuous power-supply voltage being higher than the first device voltage and having a constant magnitude; b) detecting a power-supply current flowing from the external power supply to the power storage device; and c) determining a self-discharge state of the power storage device based on the detected power-supply current.

10 Claims, 9 Drawing Sheets

METHOD FOR INSPECTING SELF-DISCHARGE OF A POWER STORAGE DEVICE AND METHOD FOR PRODUCING THE POWER STORAGE DEVICE

CROSS-REFERENCE TO RELATED APPLICATIONS

This application is based upon and claims the benefit of priority to Japanese Patent Application No. 2021-021560 filed on Feb. 15, 2021, the entire contents of which are incorporated herein by reference.

BACKGROUND

Technical Field

The present disclosure relates to a method for inspecting self-discharge of a power storage device to determine a self-discharge state of the power storage device, and a method for producing the power storage device including this self-discharge inspection method.

Related Art

In the process of producing a power storage device such as a lithium-ion secondary battery, metal foreign substances such as iron or copper may be mixed inside an electrode body or the like. Such mixed metal foreign substances may cause an internal short circuit in the power storage device, leading to self-discharge. Therefore, in the production process of the power storage device, there may be desired to determine the state of self-discharge, e.g., whether the internal short circuit exists in the power storage device and what magnitude of a self-discharge current flows.

As this method for inspecting the self-discharge of the power storage device, for example, the following methods have been known. Specifically, a pre-detection device voltage of a previously charged power storage device is measured, and a power-supply voltage equal to the pre-detection device voltage is continuously applied from an external power supply to the power storage device. Then, the power-supply current flowing from the external power supply to the power storage device gradually increases from 0 and stabilizes at a magnitude equal to the self-discharge current of the power storage device. Accordingly, this power-supply current is detected, and the magnitude of the self-discharge current of the power storage device is determined based on this detected power-supply current. A related conventional method is disclosed in for example Japanese unexamined patent application publication No. 2019-016558 (JP 2019-016558 A) (see claims of JP 2019-016558A).

SUMMARY

Technical Problems

However, even by the above-mentioned self-discharge inspection method, it takes time for the magnitude of the power-supply current to become almost stable. Thus, there has been a demand for further shortening the inspection time.

The present disclosure has been made to address the above problems and has a purpose to provide a method for inspecting self-discharge of a power storage device to shorten the time required to inspect self-discharge of the power storage device, and a method for producing the power storage device including this self-discharge inspection method.

Means of Solving the Problems (1) To achieve the above-mentioned purpose, one aspect of the present disclosure provides a method for inspecting self-discharge of a power storage device, the method comprising: a) continuously applying a continuous power-supply voltage from an external power supply to the power storage device that has been charged in advance to a first device voltage, the continuous power-supply voltage being higher than the first device voltage and having a constant magnitude; b) detecting a power-supply current flowing from the external power supply to the power storage device; and c) determining a self-discharge state of the power storage device based on the detected power-supply current.

According to the self-discharge inspection method of the power storage device described above, the continuously applying a) of the continuous power-supply voltage to the power storage device charged to the first device voltage, the detecting b) of the power-supply current, and the determining c) of the self-discharge state are performed. Moreover, the foregoing continuous power-supply voltage continuously applied in the continuously applying a) is higher than the first device voltage and has the constant magnitude. Therefore, from the beginning of the continuously applying a), unlike the conventional method, the power-supply current can be supplied to the power storage device to be inspected.

Herein, (I) if the magnitude of the power-supply current flowing to the power storage device in the beginning of the continuously applying a) when the continuous power-supply voltage is applied is equal to the magnitude of the self-discharge current flowing through the power storage device itself, a stable power-supply current equal to the self-discharge current continues to flow from the beginning of the continuously applying a).

Meanwhile, (II) if the magnitude of the power-supply current flowing to the power storage device in the beginning of the continuously applying a) when the continuous power-supply voltage is applied is smaller than the magnitude of the self-discharge current, the power-supply current gradually approaches the magnitude of the self-discharge current of the power storage device, and then becomes equal in magnitude to the self-discharge current and stable therein. This changing behavior resembles the change appearing halfway during a period in which a power-supply current having a certain magnitude flows after a lapse of time in the self-discharge inspection of the conventional method. Therefore, the power-supply current stabilizes in a shorter time than in the conventional method.

In contrast, (III) if the magnitude of the power-supply current flowing to the power storage device in the beginning of the continuously applying a) when the continuous power-supply voltage is applied is larger than the magnitude of the self-discharge current, an excess amount of the supplied power-supply current beyond the self-discharge current is used for charging the power storage device (its capacitance component). Then, the open-circuit voltage (i.e., the voltage of the capacitance component) of the power storage device, which was the first device voltage in the beginning of the continuously applying a) of the continuous power-supply voltage, rises as charged. Conversely, the power-supply current (an amount of which used for charging) decreases as the open-circuit voltage of the power storage device rises.

Then, when the new self-discharge current of the power storage device increased by the rise of the open-circuit voltage becomes equal in magnitude to the flowing power-supply current, both the charge to the power storage device (capacity component) and the self-discharge of the power storage device (capacity component) are no longer performed. Specifically, the power-supply current stabilizes when it decreases to the magnitude of the new self-discharge current. It should be noted that the foregoing rise in the open-circuit voltage of the power storage device and the increase in the self-discharge current occur promptly. That is, the power-supply current decreases and its magnitude stabilizes more rapidly as compared with the speed of increase of the power-supply current in the conventional method.

Therefore, in any case, it is possible to quickly stabilize the power-supply current flowing to the power storage device to be inspected and promptly perform the self-discharge inspection as compared with the conventional inspection method in which the continuous power-supply voltage equal to the first device voltage is continuously applied from the beginning and the power-supply current gradually increases from zero.

As will be described later, the self-discharge inspection method for the power storage device described above can be performed in the production process of the power storage device, and also can be carried out for a power storage device in use or a used power storage device after being mounted on an automobile or the like or being placed alone on the market.

Further, examples of the power storage device may include a secondary battery such as a lithium-ion secondary battery and a capacitor such as an electric double layer capacitor and a lithium-ion capacitor.

The first device voltage is an open-circuit voltage that occurs between the terminals of the power storage device when the current externally flowing to the power storage device is set to zero. For measuring this first device voltage, it is not indispensable to disconnect (open) the terminals of the power storage device from the circuit.

In the determining c), the self-discharge state is determined based on the power-supply current. Specifically, the determining c) may include a method for determining the self-discharge state by using a stabilized power-supply current that flows at the time when the power-supply current becomes stable or using a temporal change of the power-supply current until the stabilized power-supply current is reached. The method for determining the self-discharge state using the stabilized power-supply current that flows when the power-supply current becomes stable may include, for example, firstly obtaining a value of the stabilized power-supply current that flows when the power-supply current is stable, and additionally determining the quality of the self-discharge state (good (OK) or not good (NG)) based on a difference in magnitude between a value of the stabilized power-supply current and a reference threshold current value or classifying the self-discharge state into several ranks, such as A, B, and C, according to the magnitude of the stabilized power-supply current.

On the other hand, the method for determining the self-discharge state based on the temporal change of the power-supply current until the stabilized power-supply current is reached may include for example estimating an estimated stabilized power-supply current from the temporal change of the power-supply current before the stabilized power-supply current is reached, and additionally, determining the quality of the self-discharge condition (OK or NG) based on a difference in magnitude between the estimated stabilized power-supply current and a threshold current value or classifying the self-discharge state into several ranks, such as A, B, and C, according to the magnitude of the estimated stabilized power-supply current. Further, the determining method may also include a method for directly determining the quality of the self-discharge state of the power storage device or classifying the same based on an amount of change in the power-supply current per unit time.

The temporal change of the detected power-supply current means a variation with time in the power-supply current, which occurs during a period after the start of the continuously applying a) of the continuous power-supply voltage until the value of the power-supply current flowing to the power storage device becomes stable. For example, it can be indicated by an increment and an inclination of increase of the power-supply current that occurs during a predetermined period. At the time when a sufficient time elapses in the continuously applying a), a stable power-supply current flows corresponding to the magnitude of the self-discharge current flowing through the power storage device. This stable power-supply current is defined as a power-supply current in a stable state, namely, a stabilized power-supply current.

(2) In the method for inspecting self-discharge of a power storage device, described in (1), the method further may include, prior to the continuously applying a) of the continuous power-supply voltage, d) supplying a constant current having a predetermined initial current value from the external power supply placed in a constant current supply mode to the power storage device, and the continuously applying a) of the continuous power-supply voltage following the supplying d) of the constant current is configured to: e) continuously apply the continuous power-supply voltage having a magnitude equal to an initial power-supply voltage generated in the external power supply when the constant current having the initial current value is supplied to the power storage device in the supplying d).

In this inspection method, a constant current having a magnitude of an initial current value is supplied in the initial constant current supplying d). Thus, in this initial constant current supplying d), generally, the external power supply causes an initial power-supply voltage with a magnitude corresponding to the sum of the first device voltage generated by a capacitance component of the power storage device and a voltage drop due to the power-supply current of the initial current value flowing through a series resistance (DC resistance) of the power storage device. Then, in the following continuous application e) of the continuous power-supply voltage, the continuous power-supply voltage having a magnitude equal to that of the initial power-supply voltage is continuously applied. Therefore, in the beginning of this continuous application e), the power-supply current equal to the initial current value supplied in the initial constant current supplying d) flows. As described above, in this inspection method, the initial current value to be supplied in the beginning of the continuous application e) can be set to a constant value for each power storage device to be inspected, and the continuous application e) of the continuous power-supply voltage can be started under uniform conditions.

As described above, when the constant current having the magnitude of the initial current value is supplied in the initial constant current supplying d), the external power supply generally generates the initial power-supply voltage corresponding to the sum of the first device voltage that occurs in the capacitance component of the power storage device and the voltage drop that occurs in the DC resistance by the power-supply current of the initial current value. Therefore, this initial power-supply voltage is hardly affected by the amount of self-discharge current of the power storage device, and is almost the same value in each power storage device.

(3) In the method for inspecting self-discharge of a power storage device, described in (2), the initial current value may be set to be equal in magnitude to a threshold current value of a self-discharge current set in the power storage device.

In this inspection method, the initial current value is set to be equal in magnitude to the threshold current value. Therefore, in the beginning of the continuous application e), a power-supply current having the threshold current value flows to the power storage device.

Herein, (I) when the power storage device to be inspected has the self-discharge current equal to the threshold current value, the power-supply current having the threshold current value stably flows continuously from the beginning of the continuous application e).

Meanwhile, (II) when the power storage device to be inspected has the self-discharge current larger than the threshold current value, that is, when the power storage device under inspection has poor self-discharge characteristics, the magnitude of the power-supply current flowing in the continuous application e) gradually increases from the initially supplied threshold current value and then becomes equal to and stable at the self-discharge current larger than the threshold current value.

In contrast, (III) when the power storage device to be inspected has the self-discharge current smaller than the threshold current value, that is, when the power storage device under inspection has good self-discharge characteristics, the magnitude of the power-supply current flowing in the continuous application e) rapidly decreases from the initially supplied threshold current value and then becomes equal to and stable at the self-discharge current smaller than the threshold current value.

Specifically, the direction of change in the power-supply current is reversed depending on whether the self-discharge characteristic is good or poor. Therefore, according to this inspection method in which, after the start of the continuous application e), it is detected whether the power-supply current has decreased or increased from the threshold current value (the initial current value) or whether the power-supply current tends to decrease or tends to increase, it is possible to easily determine, without waiting for the power-supply current to stabilize, whether the power storage device under inspection is a non-defective power storage device having a smaller self-discharge current than the threshold current value or a defective power storage device having a larger self-discharge current than the threshold current value. This configuration further enables earlier determination.

The "threshold current value" indicates either a reference current value to be used to determine the quality of the power storage device or a plurality of reference current values to be used to determine which one of a plurality of ranks the power storage device is classified into, by comparing with the current value of the self-discharge current of the power storage device charged to the first device voltage.

(4) Alternatively, in the method for inspecting self-discharge of a power storage device, described in (1), the method further may include: prior to the continuously applying a) of the continuous power-supply voltage, f) measuring a magnitude of the first device voltage of the power storage device, and the continuously applying a) of the continuous power-supply voltage following the measuring f) configured to: g) continuously apply the continuous power-supply voltage having a magnitude corresponding to a sum of the first device voltage and a predetermined incremental voltage.

In this inspection method, for each power storage device to be inspected, the magnitude of the first device voltage is measured in the measuring f) and, in the following continuous application g), the continuous power-supply voltage is continuously applied with the magnitude corresponding to the sum of the measured first device voltage and a predetermined incremental voltage of the same magnitude between the batteries. From the beginning of the continuous application g) of the continuous power-supply voltage, therefore, each power storage device is supplied with a power-supply current corresponding to the continuous power-supply voltage (i.e., the sum of the first device voltage and the incremental voltage) to be applied. In each power storage device, the power-supply current that flows in the beginning of the continuous application g) of the continuous power-supply voltage is hardly affected by the amount of self-discharge current and becomes uniform according to the magnitude of the first device voltage generated by the capacitance component and the series resistance (the DC resistance).

Further, (I) if the magnitude of the power-supply current flowing to the power storage device in the beginning of the continuous application g) when the continuous power-supply voltage is applied is equal to the magnitude of the self-discharge current flowing through this power storage device, a stable power-supply current equal to the self-discharge current continues to flow from the beginning of the continuous application g) of the continuous power-supply voltage. That is, the power-supply current is stable from the beginning.

Meanwhile, (II) if the magnitude of the power-supply current described above is smaller than the magnitude of the self-discharge current flowing through the power storage device, the power-supply current gradually approaches the magnitude of the self-discharge current of the power storage device, and then becomes equal in magnitude to the self-discharge current and stabilizes at this magnitude.

In contrast, (III) if the magnitude of the power-supply current described above is larger than the magnitude of the self-discharge current flowing through the power storage device, the power-supply current rapidly decreases to the magnitude of a new self-discharge current and stabilizes at this magnitude.

In this inspection method, since the continuous power-supply voltage obtained by adding the same incremental voltage to the first device voltage is applied to each power storage device to be inspected, the continuous application g) of the continuous power-supply voltage can be performed under uniform conditions. In this inspection method, furthermore, the inspection can be performed without using the constant current mode or by using an external power supply having no constant current mode.

(5) In the method for inspecting self-discharge of a power storage device, described in (4), in a beginning of the continuous application g) of the continuous power-supply voltage, the incremental voltage may be set to a magnitude of a threshold incremental voltage that supplies a power-supply current equal in magnitude to a threshold current value of a self-discharge current allowable in the power storage device.

In this inspection method, the voltage increment is set to the magnitude of the above-mentioned threshold voltage increment. Specifically, in the continuous application g) of the continuous power-supply voltage, a continuous power-supply voltage having a magnitude corresponding to the sum of the measured first device voltage and a threshold incremental voltage is continuously applied to each power storage device. Thus, in the beginning of the continuous application g), a power-supply current of a threshold current value flows to each power storage device.

Herein, (I) if the power storage device to be inspected has the self-discharge current equal to the threshold current value, a power-supply current of the threshold current value stably flows continuously from the beginning of the continuous application g) of the continuous power-supply voltage.

Meanwhile, (II) if the power storage device to be inspected has the self-discharge current larger than the threshold current value, that is, if the power storage device under inspection has poor self-discharge characteristics, only the power-supply current having a threshold current value smaller than the self-discharge current of the power storage device flows in the beginning of the continuous application g) of the continuous power-supply voltage. Further, as described above, the power-supply current gradually increases from the initial current value, and the power-supply current becomes equal to and stabilizes at the self-discharge current larger than the threshold current value.

In contrast, (III) if the power storage device to be inspected has the self-discharge current smaller than the threshold current value, that is, if the power storage device under inspection has good self-discharge characteristics, a power-supply current having a threshold current value larger than the self-discharge current of the power storage device flows in the beginning of the continuous application g) of the continuous power-supply voltage. As described above, an excess amount of the power-supply current to be supplied beyond the self-discharge current is used for charging the power storage device (its capacitance component), and the power-supply current rapidly decreases from the initial threshold current value with time in the continuous application g) of the continuous power-supply voltage, and then becomes equal to the self-discharge current smaller than the threshold current value, and stabilizes thereat.

Specifically, the direction of change in the power-supply current is reversed depending on whether the self-discharge characteristic is good or poor. Therefore, according to this inspection method in which, after the start of the continuous application g) of the continuous power-supply voltage, it is detected whether the power-supply current has decreased or increased from the threshold current value (the initial current value) or whether the power-supply current tends to decrease or tends to increase, it is possible easily determine, without waiting for the power-supply current to stabilize, whether the power storage device is a non-defective power storage device having a smaller self-discharge current than the threshold current value or a defective power storage device having a larger self-discharge current than the threshold current value. This configuration further enables earlier determination.

As described above, the "threshold current value" indicates either a reference current value to be used to determine the quality of the power storage device or a plurality of reference current values to be used to determine which one of a plurality of ranks the power storage device is classified into, by comparing with the current value of the self-discharge current of the power storage device charged to the first device voltage.

The "threshold incremental voltage" indicates an incremental voltage having a magnitude that allows a power-supply current equal to the threshold current value to flow when a continuous power-supply voltage having a magnitude corresponding to the sum of the first device voltage and the threshold incremental voltage is applied from an external power supply to the power storage device charged to the first device voltage.

(6) Another aspect of the present disclosure provides a method for producing a power storage device, the method comprising: h) initially charging an assembled and uncharged power storage device to a predetermined charged state to provide a previously charged power storage device; and i) inspecting a self-discharge state of the previously charged power storage device by the self-discharge inspection method for the power storage device according to one of the foregoing methods (1) to (5).

In the above-mentioned power storage device producing method, the inspecting i) using the foregoing self-discharge inspection method is performed after the initially charging h). This method therefore can produce the power storage device by appropriately inspecting the presence or absence of a short circuit and the degree of the short circuit in the initial stage of the power storage device in short time.

It is more preferable to provide a high temperature aging process in which the power storage device is left in an open state at a high temperature and a following cooling process between the initially charging h) and the inspecting i), because these processes enable the voltage of the power storage device to easily stabilize.

DETAILED DESCRIPTION OF THE EXEMPLARY EMBODIMENTS

First Embodiment

Figure 1:
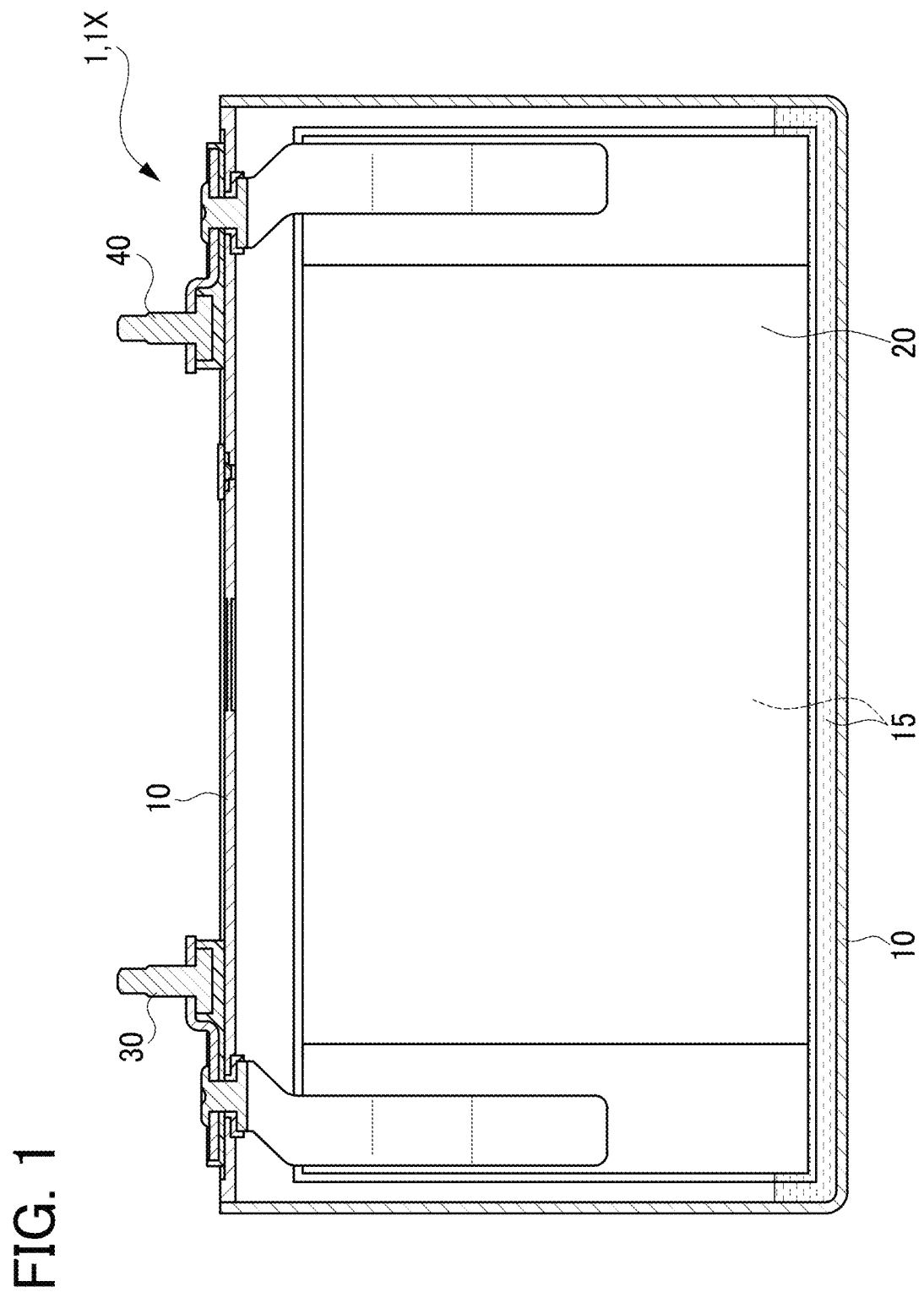
FIG. 1 is a longitudinal cross-sectional view of a battery in first and second embodiments and first and second modified embodiments.

A detailed description of a first embodiment of this disclosure will now be given referring to the accompanying drawings. FIG. 1 is a longitudinal cross-sectional view of a lithium-ion secondary battery (hereinafter, also simply referred to as a battery) 1 in the first embodiment. This battery 1 includes a rectangular parallelepiped box-shaped battery case 10, a flat wound electrode body 20 and an electrolytic solution 15, which are accommodated in the battery case 10, a positive terminal member 30 and a negative terminal member 40 supported in the battery case 10, and others. In the first embodiment, the positive active material is a lithium transition metal composite oxide, specifically, lithium nickel cobalt manganese oxide, and the negative active material is carbon material, specifically, graphite. The same applies to batteries 1 in first and second modified embodiments, a second embodiment, and a reference embodiment, which will be described later.

A self-discharge inspection method for determining the internal insulation property of the battery 1 and a method for producing the battery 1 including this self-discharge inspection method will be described below (see FIG. 2). In an assembly step S1, an uncharged battery 1X (see FIG. 1) is assembled. An initial constant current supplying step S6 to a determination step S10 which will be mentioned later also correspond to an inspection step in the method for producing the battery 1.

In an initial charge step S2, the assembled battery 1 is charged for the first time to provide a charged battery 1. Specifically, ten batteries 1 (i.e., ten batteries 1X) arranged in a row in a battery thickness direction, which is a direction perpendicular to the paper sheet of FIG. 1, are restrained by use of a restraining jig (not shown) so that each battery 1 (each battery 1X) is compressed in the battery thickness direction. In such a restrained state, each battery 1 (each battery 1X) is subjected to the initial charge step S2 through a continuation judgement step S9 described later. In each step, an ambient temperature TK of each battery 1 is detected by use of a temperature detecting device KTS having a temperature sensor KT including a thermistor. Further, a battery temperature TB of each battery 1 is detected by a temperature detecting device STS having a temperature sensor ST placed in contact with the battery case 10 at a predetermined position (see FIG. 3).

After the batteries 1X are restrained with the restraining jig, a charging-discharging device (not shown) is connected to both the terminal members 30 and 40 of each battery 1X under an initial-charge temperature FT (FT=20° C.) to initially charge each battery 1 by a constant current constant voltage (CCCV) until a battery voltage VB of each battery 1X reaches a predetermined value, e.g., 4.0 V in the present embodiment.

In a high-temperature aging step S3, subsequently, the batteries 1 initially charged are left to stand for an aging period EK (EK=20 hours) under an aging temperature ET (ET=63° C.) while both the terminal members 30 and 40 of each battery 1 are opened. By this high-temperature aging, the battery voltage VB of each battery 1 decreases to a battery voltage corresponding to about 80% SOC.

In a cooling step S4, the batteries 1 are placed in a cooling chamber CR under a cooling temperature CT (CT=20° C.) for 20 minutes and forcibly cooled with a fan to adjust the battery temperature TB to approximately 20° C., i.e., TB 20° C. (see FIG. 2).

Figure 2:
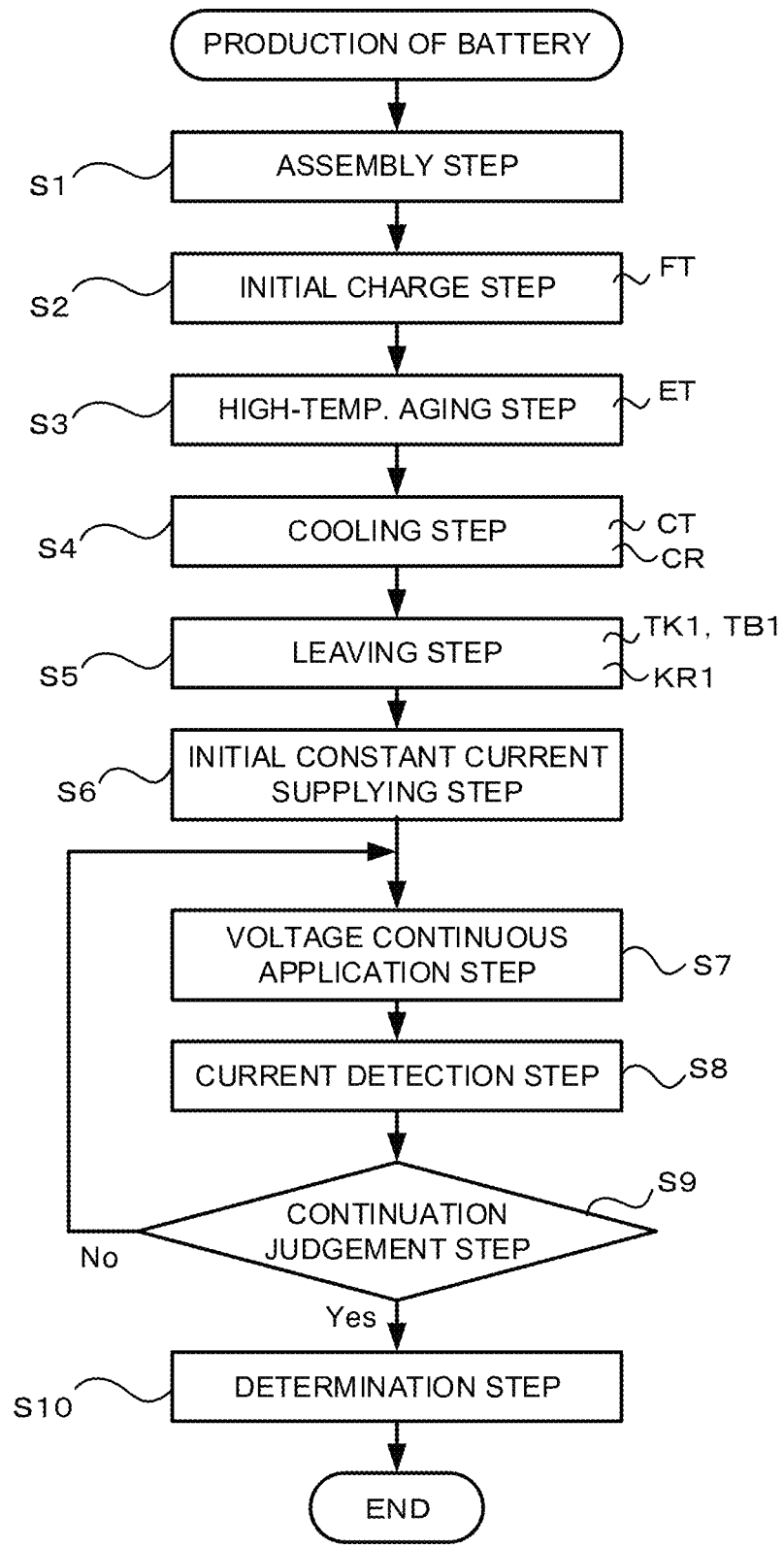
FIG. 2 is a flowchart of a process of producing a battery, including a battery self-discharge inspection process in the first embodiment and the first and second modified embodiments.

In a leaving step S5, furthermore, the batteries 1 are transferred into a first chamber KR1 with the ambient temperature TK controlled to a first ambient temperature TK1 (TK1=20.0° C.), and left to stand for a leaving period HP (e.g., HP=30 minutes) to regulate the battery temperature TB of each battery 1 to a battery temperature TB1 (TB1=20.0° C.) equal to the first ambient temperature TK1 (see FIG. 2). After the leaving step S5, the initial constant current supplying step S6 through the continuation judgement step S9 which will be described later are also performed under the condition that the battery temperature TB of each battery 1 is the first battery temperature TB1.

Figure 3:
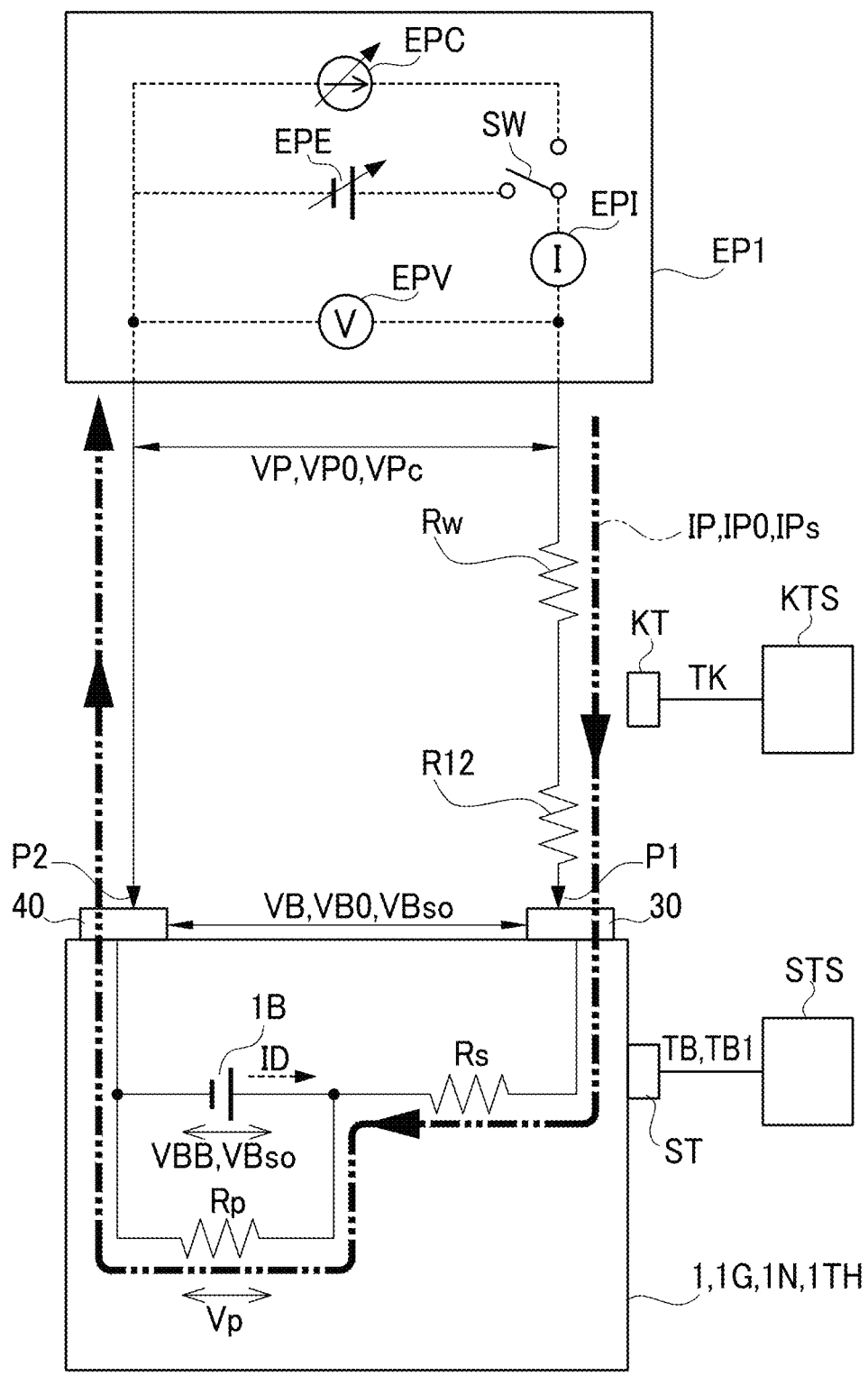
FIG. 3 is a circuit diagram related to the self-discharge inspection method for the battery in the first embodiment and the first and second modified embodiments, showing a state that an external power supply is connected to the battery.

In the following initial constant current supplying step S6, a constant current (an initial current value IP0) is supplied to each battery 1 having the first battery temperature TB1 (TB1=20.0° C.). Specifically, as shown in FIG. 3, an external power supply EP1 is connected to each battery 1, a power-supply current IP flowing from the external power supply EP1 to the battery 1 is set to a constant current having the initial current value IP0 (IP=IP0), and an initial power-supply voltage value VP0 thus generated in the external power supply EP1 is measured. More specifically, a pair of probes P1 and P2 of the external power supply EP1 are respectively brought into contact with the positive terminal member 30 and the negative terminal member 40 of the battery 1 and a switch SW is turned to set a constant current power-supply mode in a DC current supply EPC of the external power supply EP1, thereby supplying the power-supply current IP having the initial current value IP0 from the DC current supply EPC. An initial power-supply voltage value VP0 generated in the external power supply EP1 at that time is measured with a voltmeter EPV (see FIG. 3). In the first embodiment, for example, the initial current value IPO is set to 10 µA. This initial current value IP0 (IP=10 µA) is smaller in magnitude than a self-discharge current (ID=15 µA) flowing to a typical non-defective battery 1G.

While the first probe P1 remains in contact with the positive terminal member 30 and the second probe P2 remains in contact with the negative terminal member 40, i.e., the pair of probes P1 and P2 are neither disconnected nor reconnected to the terminal members 30 and 40, the initial constant current supplying step S6 through the continuation judgement step S9 mentioned later are performed. The same applies to the first and second modified embodiments. This is to prevent the contact state of the probe P1 with the terminal member 30 and the contact state of the probe P2 with the terminal member 40 from becoming different every time they are disconnected and reconnected, and thus avoid variation in the magnitude of the contact resistance R12 generated between the probe P1 and the positive terminal member 30 and between the probe P2 and the negative terminal member 40.

In FIG. 3, a wiring resistance Rw indicates a wiring resistance distributed in the external power supply EP1 and from the external power supply EP1 to the probes P1 and P2. The contact resistance R12 indicates the sum of the contact resistance generated between the first probe P1 of the external power supply EP1 and the positive terminal member 30 of the battery 1 and the contact resistance generated between the second probe P2 of the external power supply EP1 and the negative terminal member 40 of the battery 1.

Further, FIG. 3 (and FIG. 8 described later) also shows an equivalent circuit of the battery 1 (a non-defective battery 1G, a defective battery 1N, and a threshold battery 1TH) including a battery component 1B, a series resistance Rs, and a short-circuit resistance Rp. The battery component 1B is a capacitance component provided by the battery 1 and assumed to generate a battery component voltage VBB. The series resistance Rs is a battery resistance that appears to exist in series with the battery component 1B between the both terminal members 30 and 40 of the battery 1. In contrast, the short-circuit resistance Rp is a resistance representing a magnitude of self-discharge caused by an internal short-circuit of the battery 1. A self-discharge current ID indicated by an arrowed broken line indicates a self-discharge current flowing from the battery component 1B to the short-circuit resistance Rp.

In each of the embodiments and modified embodiments, the behaviors of two or more batteries 1 (non-defective batteries 1G, defective batteries 1N, and threshold batteries 1TH) will be considered below; however, the batteries 1 differ from each other only in the magnitude of the short-circuit resistance Rp and the magnitude of a self-discharge current ID flowing through this resistance Rp for easy consideration. The capacitance of the battery component 1B and the magnitude of the series resistance Rs are assumed to be the same (equal) between the batteries 1. The wiring resistance Rw and the contact resistance R12 are also assumed to be equal between the batteries 1. Further, the batteries 1 are also equal to each other in an initial open battery voltage VBso, that is, the magnitude of the battery component voltage VBB of the battery component 1B in the initial constant current supplying step S6, an initial battery voltage measurement step S26, and in the beginning (a voltage application time t=0) of a voltage continuous application step S7 and S27.

The external power supply EP1 used in the first embodiment and first and second modified embodiments shown in FIG. 3 is a variable constant-voltage constant-current power supply that can switch, using a switch SW, between a constant voltage power-supply mode using a DC voltage supply EPE and a constant current power-supply mode using a DC current supply EPC. The external power supply EP1 is also a precision DC current supply that can variably and precisely control a power-supply voltage VS generated by the DC voltage supply EPE and variably and precisely control the power-supply current IP caused to flow from the DC current supply EPC. This external power supply EP1 further includes an ammeter EPI capable of precisely measuring the power-supply current IP flowing from the external power supply EP1 to the battery 1 as well as the voltmeter EPV capable of precisely measuring a power-supply voltage VP to be applied to the battery 1. The ambient temperature TK around the battery 1 is detected by use of the temperature detecting device KTS having the temperature sensor KT including a thermistor. Further, the battery temperature TB of the battery 1 is detected by the temperature detecting device STS having the temperature sensor ST including a thermistor.

In the first embodiment, as described above, in the initial constant current supplying step S6, the external power supply EP1 is connected to the battery 1 having the first battery temperature TB1 having become equal to the first ambient temperature TK1 (TB1=TK1=20.0° C.) under the first ambient temperature TK1, and then the power-supply current IP of the initial current value IP0 (IP=IP0=10 μA) is supplied. Then, the power-supply current IP flows through a path indicated by arrows with a dashed-dot line in the battery 1 and also an initial battery voltage VB0 corresponding to the initial current value IP0 is generated in the battery 1. This initial battery voltage VB0 is a battery voltage obtained under the condition that the initial current value IP0 is flowing and thus it is slightly larger than the initial open battery voltage VBso which is an open voltage of the battery 1 (i.e., a battery voltage for the power-supply current IP=0) by for example about several to several dozen μV (VBo>VBso). The initial power-supply voltage value VP0 generated in the external power supply EP1, including a voltage drop caused by the initial current value IP0 flowing through the contact resistance R12 and the wiring resistance Rw, is measured by the voltmeter EPV. Accordingly, as the initial power-supply voltage value VP0, a value slightly larger (e.g., by about several dozen μV) than the initial battery voltage VB0 (VP0>VB0>VBso), that is, a value in the vicinity of 3.9 V, is determined. This initial constant current supplying step S6 is a process to obtain the initial power-supply voltage value VP0 and therefore may be immediately stopped (e.g., within a few seconds) when the initial power-supply voltage value VP0 is obtained.

The battery component voltage VBB coincides with the battery voltage VB when the power-supply current IP is zero (IP=0). Thus, in the initial constant current supplying step S6 and at the start time of the following voltage continuous application step S7 (the voltage application time t=0), the battery component voltage VBB is equal to the initial open battery voltage VBso (VBB=VBso, t=0).

In the voltage continuous application step S7, successively, under the first ambient temperature TK1, when the first battery temperature TB1 becomes equal to the first ambient temperature TK1, the switch SW is turned to set a constant voltage power-supply mode, in which the DC voltage supply EPE of the external power supply EP1 is caused to generate a continuous power-supply voltage VPc equal to the initial power-supply voltage value VP0 (VPc=VP0) that is obtained in the foregoing initial constant current supplying step S6 and is slightly larger than the initial open battery voltage VBso. Then, voltage application to the battery 1 is started (the voltage application time t=0) and, from this point forward, the continuous power-supply voltage VPc is continuously applied. Specifically, the continuous power-supply voltage VPc generated in the external power supply EP1 is maintained at a magnitude equal to the initial power-supply voltage value VP0 obtained in the beginning. Accordingly, the power-supply current IP flows to the battery 1 from the beginning of the voltage continuous application step S7, unlike the conventional art in which a power-supply current does not initially flow because of VPc=VBso.

In a current detection step S8, the power-supply current IP is detected by the ammeter EPI. Specifically, the power-supply current value IP(n) (wherein n is an integer of 0 or more and indicates the order of acquisition) of the power-supply current IP flowing from the external power supply EP1 to the battery 1 is acquired at every predetermined elapsed time, e.g., at intervals of 10 seconds in the present embodiment. The power-supply current value IP(0) of the power-supply current IP in the beginning of application of the continuous power-supply voltage VPc (the voltage application time t=0) becomes equal to the initial current value IP0 (IP(0)=IP0) supplied in the initial constant current supplying step S6. In the first embodiment, however, the power-supply current IP (the power-supply current value IP(n)) changes with the passage of the voltage application time t and approaches the magnitude of the unique self-discharge current ID different from one battery 1 to another as described later. Then, the power-supply current IP becomes equal to the self-discharge current ID and stabilizes thereat.

In the continuation judgement step S9, it is determined whether to repeat the voltage continuous application step S7 and the current detection step S8 again. In the first embodiment, specifically, it is determined whether the power-supply current IP (concretely, the power-supply current value IP(n)) has stabilized after the start of application of the continuous power-supply voltage VPc to the battery 1. Herein, if No, i.e., if the power-supply current IP is not stable, the process returns to the voltage continuous application step S7 to continue the application of the continuous power-supply voltage VPc to the battery 1 (S7) and further detect the power-supply current IP again (S8). In contrast, if Yes, i.e., if the power-supply current IP is stable, the process advances to the determination step S10 which will be described later.

In the continuation judgement step S9, the method for determining whether the power-supply current IP has stabilized may include for example sequentially calculating a moving average of the power-supply current values IP(n) (e.g., a moving average of seven power-supply current values IP(n−6) to IP(n) obtained for last 60 seconds) and determining whether the power-supply current value IP(n) has stabilized based on the transition of the moving average values (e.g., the magnitude of a difference value or a derivative value of the moving average values).

In the voltage continuous application step S7 in the first embodiment, as described above, while the ambient temperature TK is maintained at the first ambient temperature TK1 and the battery temperature TB is maintained at the first battery temperature TB1 (TB1=TK1=20.0° C.), the continuous power-supply voltage VPc equal to the initial power-supply voltage value VP0 is continuously applied to each battery 1. In this case, the following consideration is given to how the power-supply current value IP(n) of the power-supply current IP flowing from the external power supply EP1 to the battery 1 changes.

As described above, when the voltage application time t is 0, the battery component voltage VBB is equal to the initial open battery voltage VBso (VBB=VBso, t=0).

Reference Embodiment

Figure 4:
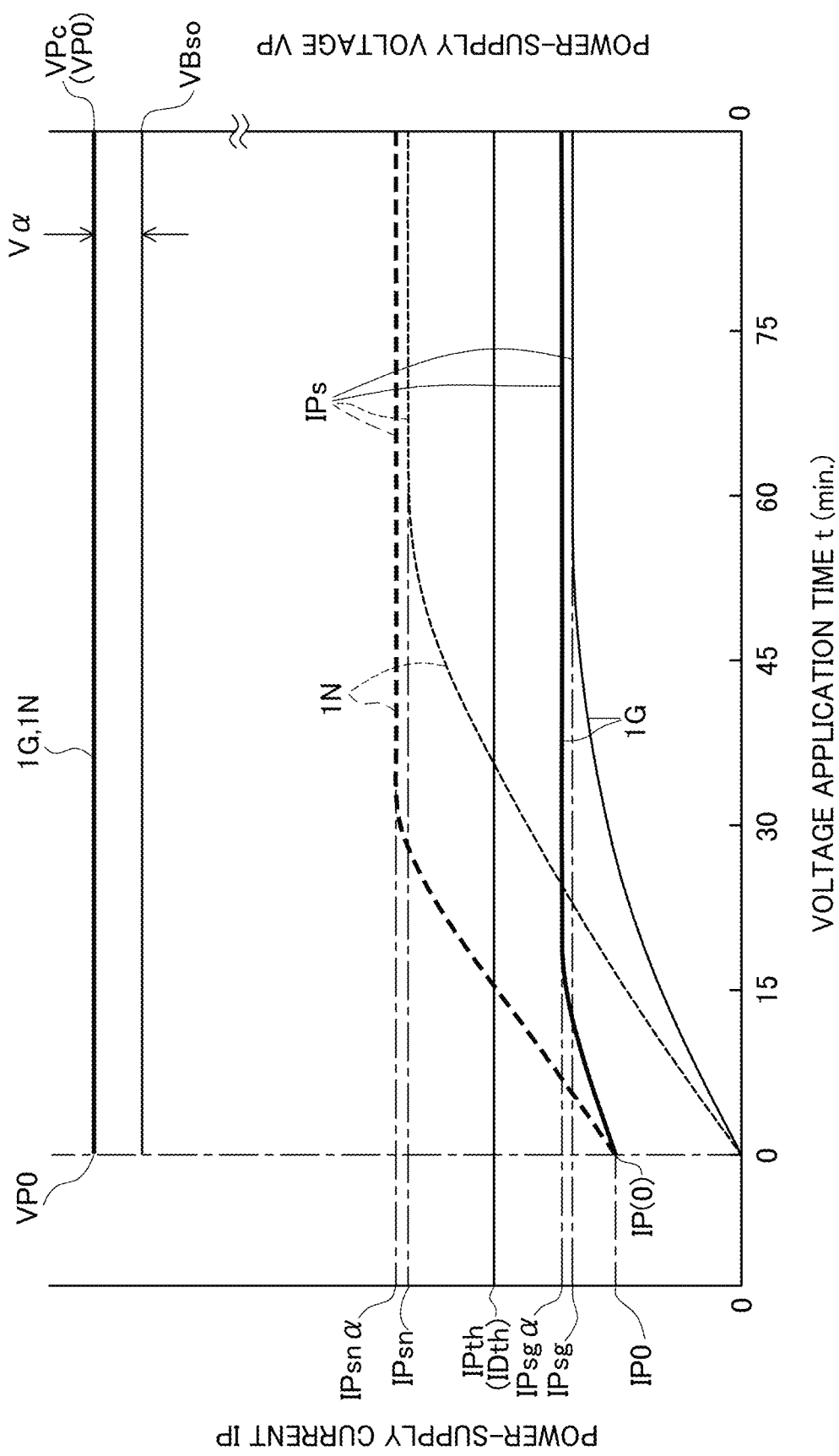
FIG. 4 is a graph schematically showing temporal changes in power-supply voltage and power-supply current with respect to a voltage application time in each of non-defective batteries and defective batteries in the first embodiment and a reference embodiment.

Herein, as a reference embodiment, the following consideration is made referring to FIGS. 3 and 4 about the method described in JP 2019-016558 A, that is, how the power-supply current IP changes while the initial open battery voltage VBso is continuously applied from the external power supply EP1 to the battery 1 after the start of the voltage application (t=0), as shown by a thin solid line in the upper part of FIG. 4.

When the initial open battery voltage VBso is continuously applied from the external power supply EP1 to the battery 1, the battery component voltage VBB of the battery component 1B gradually decreases with the lapse of the voltage application time t from the initial open battery voltage VBso occurring at the start of the voltage continuous application step S7 (the voltage application time t=0). This is because the electric charge stored in the battery component 1B is gradually discharged by the self-discharge current ID through the short-circuit resistance Rp.

Therefore, the power-supply current IP does not flow (IP(0)=0) in the beginning of application of the initial open battery voltage VBso (the voltage application time t=0). However, when the battery component voltage VBB generated by the battery component 1B decreases, a potential difference (VBso−VBB) is generated between both ends of the series resistance of three resistances, that is, the series resistance Rs, the contact resistance R12, and the wiring resistance Rw, as can be easily understood from FIG. 3. Thus, the corresponding power-supply current IP flows to the battery 1 through a path as indicated by an arrowed two-dot chain line (VBso=VBB+(Rs+R12+Rw)·IP).

Then, as indicated by a thin solid line or a thin broken line in the lower part of FIG. 4, the magnitude of the power-supply current IP in this reference embodiment gradually increases as the battery component voltage VBB of the battery component 1B decreases. However, as can be understood from FIG. 3, when the power-supply current IP increases as the battery component voltage VBB decreases, and the back electromotive force Vp (=Rp·IP) generated in the short-circuit resistance Rp by the power-supply current IP flowing through the short-circuit resistance Rp becomes equal to the battery component voltage VBB generated in the battery component 1B, the self-discharge current ID no longer flows out from the battery component 1B. As a result, the battery component voltage VBB of the battery component 1B also stops decreasing. The power-supply current IP then becomes stable at a stabilized power-supply current IPs equal to the self-discharge current ID.

Thus, if the battery 1 to be inspected is a non-defective battery 1G, i.e., a battery having a large short-circuit resistance Rp and a self-discharge current ID smaller than the threshold current value IDth, the battery component voltage VBB of the battery component 1B slowly decreases and hence the power-supply current IP also slowly increases (see the thin solid line in the lower part of FIG. 4). Further, a stabilized power-supply current value IPsg of this non-defective battery 1G is small (for example, a value IPsg of a typical non-defective battery 1G is assumed to be 15 µA (IPsg=15 µA)).

In contrast, when the battery 1 to be inspected is a defective battery 1N, i.e., a battery having a small short-circuit resistance Rp as compared with the non-defective battery 1G and a self-discharge current ID larger than the threshold current value IDth, the battery component voltage VBB of the battery component 1B relatively significantly decreases as compared with the non-defective battery 1G and thus the power-supply current IP also relatively greatly increases (see the thin broken line in the lower part of FIG. 4). A stabilized power-supply current value IPsn of this defective battery 1N is also larger than the stabilized power-supply current value IPsg of the non-defective battery 1G; for example, the stabilized power-supply current value IPsn of a typical defective battery 1N is assumed to be 27 µA which is larger than IPsg (IPsn=27 µA>IPsg).

Therefore, the quality of the battery 1 under inspection can be determined based on the magnitude of the stabilized power-supply current value IPs (IPsg, IPsn) or the magnitude and the changing state of an increase rate of the power-supply current IP (i.e., a temporal change in the power-supply current IP) (see JP 2019-016558 A). For example, in the lower graph of FIG. 4, a threshold current value IPth of the power-supply current IP, equal to the threshold current value IDth of the self-discharge current ID, is set to an intermediate value between the stabilized power-supply current value IPsg of the non-defective battery 1G and the stabilized power-supply current value IPsn of the defective battery 1N (e.g., IPth is assumed to be 20 µA), as indicated by the thin solid line in FIG. 4. Accordingly, by comparison between the obtained stabilized power-supply current value IPs (IPsg, IPsn) and the threshold current value IPth, whether the relevant battery 1 is a non-defective product can be determined.

In the foregoing method in the reference embodiment, however, it takes time from the start of application of the continuous power-supply voltage VPc to the battery 1 (t=0) until determination of the quality of the battery 1 is enabled. This is because the power-supply current IP gradually increases and then reaches the stabilized power-supply current IPs so as to compensate for a decrease in the battery component voltage VBB caused when the electric charge of the capacitance component 1B of the battery 1 is discharged through the short-circuit resistance Rp. For example, for performing the determination by obtaining the value of the stabilized power-supply current IPs, it is necessary to wait until the value of the stabilized power-supply current IPs is obtained. For instance, the foregoing example indicated by the thin solid line and the thin broken line in the lower graph of FIG. 4 reveals that it is necessary to wait until 55 minutes or more of the voltage application time t passes to obtain the value of the stabilized power-supply current IPs (IPsg, IPsn).

The reason why it takes long until determination of the quality of the battery 1 is enabled as above is as follows. In the foregoing method of the reference embodiment (JP 2019-016558 A), as can be understood from the lower graph in FIG. 4, the initial open battery voltage VBso is continuously applied in the voltage continuous application step S7 and therefore the determination is started from when the power-supply current value IP(0) of the power-supply current IP is zero (IP(0)=0) in the beginning of application start (the voltage application time t=0). It therefore takes time for the power-supply current value IP(n) to reach the stabilized power-supply current IPs.

In the first embodiment, therefore, as shown by a thick solid line and a thick broken line in the lower graph in FIG. 4, every battery 1 to be inspected is supplied with the power-supply current IP having the same initial current value IP0 (IP(0)=IP0) from the start of the voltage continuous application step S7 (the voltage application time t=0). In the first embodiment, accordingly, the time required for the power-supply current IP(n) obtained in the current detection step S8 to reach the stabilized power-supply current IPs is shortened as compared with the reference embodiment.

Herein, assuming that the battery 1 to be inspected is a non-defective battery 1G, the following consideration is made. In this case, in the initial constant current supplying step S6, when the power-supply current IP having an initial current value IP0 (e.g., IP0=10 μA) is supplied, a power-supply voltage VP having a magnitude of the initial power-supply voltage value VP0 is generated in the external power supply EP1. Because the power-supply current IP having the initial current value IP0 is supplied, the magnitude of this initial power-supply voltage value VP0 is slightly higher (by a difference voltage Vα) than the initial open battery voltage VBso indicated by the thin solid line in the reference embodiment. In the voltage continuous application step S7, as indicated by a thick solid line in an upper graph in FIG. 4, the continuous power-supply voltage VPc having a magnitude equal to this initial power-supply voltage value VP0 is continuously applied. Then, as indicated by the thick solid line in the lower graph in FIG. 4, the power-supply current IP having a magnitude equal to the initial current value IP0 (IP(0)=IP0) flows in the beginning of the voltage continuous application step S7 (the voltage application time t=0). Then, the power-supply current IP gradually increases and becomes stable at a stabilized power-supply current value IPsgα of a non-defective battery 1G slightly higher (by an amount corresponding to a difference voltage Vα) than the stabilized power-supply current value IPsg of the non-defective battery 1G in the reference embodiment. Herein, as can be easily understood by comparison with the reference embodiment indicated by the thin solid line, it is revealed from comparison of the non-defective batteries 1G between the reference embodiment and the first embodiment that the method of the first embodiment can greatly shorten the time required for the power-supply current IP to stabilize as compared with the method in the reference embodiment.

Next, assuming that the battery 1 to be inspected is a defective battery 1N, the following consideration is made. Also in this case, in the initial constant current supplying step S6, when the power-supply current IP having the initial current value IP0 (e.g., IP0=10 μA) is supplied, a power-supply voltage VP having a magnitude of the initial power-supply voltage value VP0 is generated in the external power supply EP1. Regardless of whether the battery 1 is the defective battery 1N or the non-defective battery 1G mentioned above, the magnitude of the initial power-supply voltage value VP0 is almost the same. This is because the initial power-supply voltage value VP0 generally becomes a value corresponding to the sum of the open voltage (the initial open battery voltage VBso) and a voltage drop caused by the power-supply current IP having the initial current value IP0 flowing through the series resistance of three resistances, i.e., the series resistance Rs, the contact resistance R12, and the wiring resistance Rw. In the voltage continuous application step S7, further, the continuous power-supply voltage VPc having a magnitude equal to this initial power-supply voltage value VP0 is continuously applied. Then, the power-supply current IP changes as indicated by the thick broken line in the lower graph in FIG. 4. Specifically, in the beginning of the voltage continuous application step S7 (the voltage application time t=0), the power-supply current IP having a magnitude equal to the initial current value IP0 (IP(0)=IP0) flows as in the non-defective battery 1G. However, after that, the power-supply current IP increases gradually, but more largely than in the non-defective battery 1G, and becomes stable at the stabilized power-supply current value IPsnα slightly higher than the stabilized power-supply current value IPsn of the defective battery 1N in the reference embodiment. Herein, as can be easily understood by comparison with the reference embodiment indicated by the thin broken line, even when the defective batteries 1N are compared to each other, the method of the first embodiment can greatly shorten the time required for the power-supply current IP to stabilize as compared with the reference embodiment.

Consequently, regardless whether the battery 1 is the non-defective battery 1G or the defective battery 1N, the first embodiment enables earlier determination of the self-discharge state of the battery 1 in the determination step S10 as compared with the reference embodiment.

In the determination step S10, the self-discharge state of the battery 1 is determined based on the obtained power-supply current IP, concretely, by use of the sequence of the power-supply current values IP(0), IP(1), ..., IP(n) which are obtained after the start of the voltage continuous application step S7 (the voltage application time t=0).

To be specific, in the first embodiment, from among a series of power-supply current values IP(0), IP(1), ..., IP(n) obtained at predetermined time intervals (every 10 seconds in the present embodiment), seven power-supply current values IP(n−6) to IP(n) obtained in the terminal stage (the end stage) of the voltage continuous application step S7 (for the last 60 seconds in the present embodiment) are used.

These values are averaged to calculate an average terminal power-supply current value IPE (IPE=(IP(n−6)+ . . . +IP(n))/7). The average terminal power-supply current value IPE indicates a magnitude of the stabilized power-supply current IPs obtained in the terminal stage of the voltage continuous application step S7. This is compared with the threshold current value IPth and a battery 1 having a smaller average terminal power-supply current value IPE than the threshold current value IPth (IPE<IPth) is determined to be a non-defective battery 1G. Thus, a battery 1 (a non-defective battery 1G) having been charged and inspected for its self-discharge state can be produced.

In contrast, a battery 1 of which the average terminal power-supply current value IPE is equal to or larger than the threshold current value IPth (IPE≥IPth) is determined to be a defective battery 1N. The battery 1 determined to be the defective battery 1N is excluded and discarded or alternatively is reused after disassembly and so on.

In the foregoing first embodiment, in the determination step S10, e.g., a plurality of power-supply current values IP(n) obtained in the terminal stage are averaged to calculate the average terminal power-supply current value IPE corresponding to a value of the stabilized power-supply current IPs, and this is compared with the threshold current value IPth to determine the quality of the battery 1.

However, among the moving average values MIP(n) obtained in the continuation judgement step S9 from the plurality of (e.g., seven) power-supply current values IP(n−6) to IP(n) obtained most recently, the last moving average value MIP(n) may be set to the foregoing average terminal power-supply current value IPE to determine the self-discharge state of the battery 1 in the determination step S10. In the determination step S10, specifically, the quality of the battery 1 may be determined by comparison between the last moving average value MIP(n) obtained in the continuation judgement step S9 and the threshold current value IPth.

According to the above-described method of the first embodiment, it is possible to quickly stabilize the power-supply current IP flowing to the battery 1 to be inspected and thus promptly perform the self-discharge inspection in the inspection steps S6 to S10.

In the method for producing the battery 1 in the first embodiment, after the end of the initial charge step S2, the inspection steps S6 to S10 using the self-discharge inspection method are performed. Therefore, in producing the battery 1, the battery 1 can be appropriately inspected in short time for the presence or absence of a short circuit and the degree of the short circuit in the initial stage of the battery 1.

According to the inspection method in the first embodiment, for each battery 1 to be inspected, the initial current value IP0 to be supplied in the beginning of the voltage continuous application step S7 can be set to be constant (e.g., IP0=10 μA in the present embodiment) so that the voltage continuous application step S7 is started under uniform conditions.

First Modified Embodiment

In the above-described first embodiment (see FIG. 4), in the initial constant current supplying step S6, the magnitude of the power-supply current IP to be supplied to the battery 1, i.e., the initial current value IP0, is set to for example 10 μA, which is smaller than the threshold current value IPth (IPth=20 μA). Furthermore, the initial current value IP0 is set to be smaller than the typical stabilized power-supply current value IPsgα of the non-defective battery 1G (a typical value IPsgα is assumed to be 15 μA). However, the magnitude of the power-supply current IP to be supplied to the battery 1 in the initial constant current supplying step S6 may be set equal to the threshold current value IPth (First modified embodiment) or alternatively may be larger than the current value IPth (Second modified embodiment).

In this first modified embodiment, therefore, the following example will be described, mainly referring to FIGS. 3 and 5, in which the initial current value IP0 of the power-supply current IP to be supplied to the battery 1 in the initial constant current supplying step S6 is set to be equal to the threshold current value IPth (e.g., IP0=IPth=20 μA), even though it is a similar manner to the first embodiment.

Behaviors of the non-defective battery 1G, defective battery 1N, and threshold battery 1TH in the initial constant current supplying step S6 and the voltage continuous application step S7 are first examined. The threshold battery 1TH is a battery 1 in which a self-discharge current ID flowing through the short-circuit resistance Rp has a magnitude equal to the threshold current value IDth (=IPth) (ID=IDth=IPth=20 μA in the first embodiment) when the battery 1 is charged to the initial open battery voltage VBso (e.g., 3.9 V), that is, the battery component voltage VBB of the battery component 1B is set to the initial open battery voltage VBso. Meanwhile, the non-defective battery 1G is a battery having a larger short-circuit resistance Rp and a smaller self-discharge current ID (ID<IPth) when the battery is charged to the same initial open battery voltage VBso as compared with the threshold battery 1TH. In contrast, the defective battery 1N is a battery having a smaller short-circuit resistance Rp and a larger self-discharge current ID (ID>IPth) when the battery is charged to the same initial open battery voltage VBso as compared with the threshold battery 1TH.

When a power-supply current IP having an initial current value IP0 (=the threshold current value IPth=20 μA) is supplied to the battery 1 in the initial constant current supplying step S6, a power-supply voltage VP having a magnitude of an initial power-supply voltage value VP0 is generated in the external power supply EP1. As described in the first embodiment, the magnitude of the initial power-supply voltage value VP0 is almost the same regardless of whether the battery 1 is the non-defective battery 1G or the defective battery 1N. In the voltage continuous application step S7, therefore, a continuous power-supply voltage VPc having the same magnitude as the initial power-supply voltage value VP0 is continuously applied to each battery 1 as indicated by a thick solid line in an upper graph in FIG. 5. Further, the power-supply current value IP(0) initially flowing in the voltage continuous application step S7 is the threshold current value IPth equal to the threshold current value IDth of the self-discharge current ID of the threshold battery 1TH. If the battery 1 under inspection is the threshold battery 1TH, therefore, the power-supply current IP is stable from the beginning as indicated by a thick dashed-dot line in a lower graph in FIG. 5. Even after a lapse of the voltage application time t, the power-supply current IP thus remains equal to the threshold current value IPth.

Figure 5:
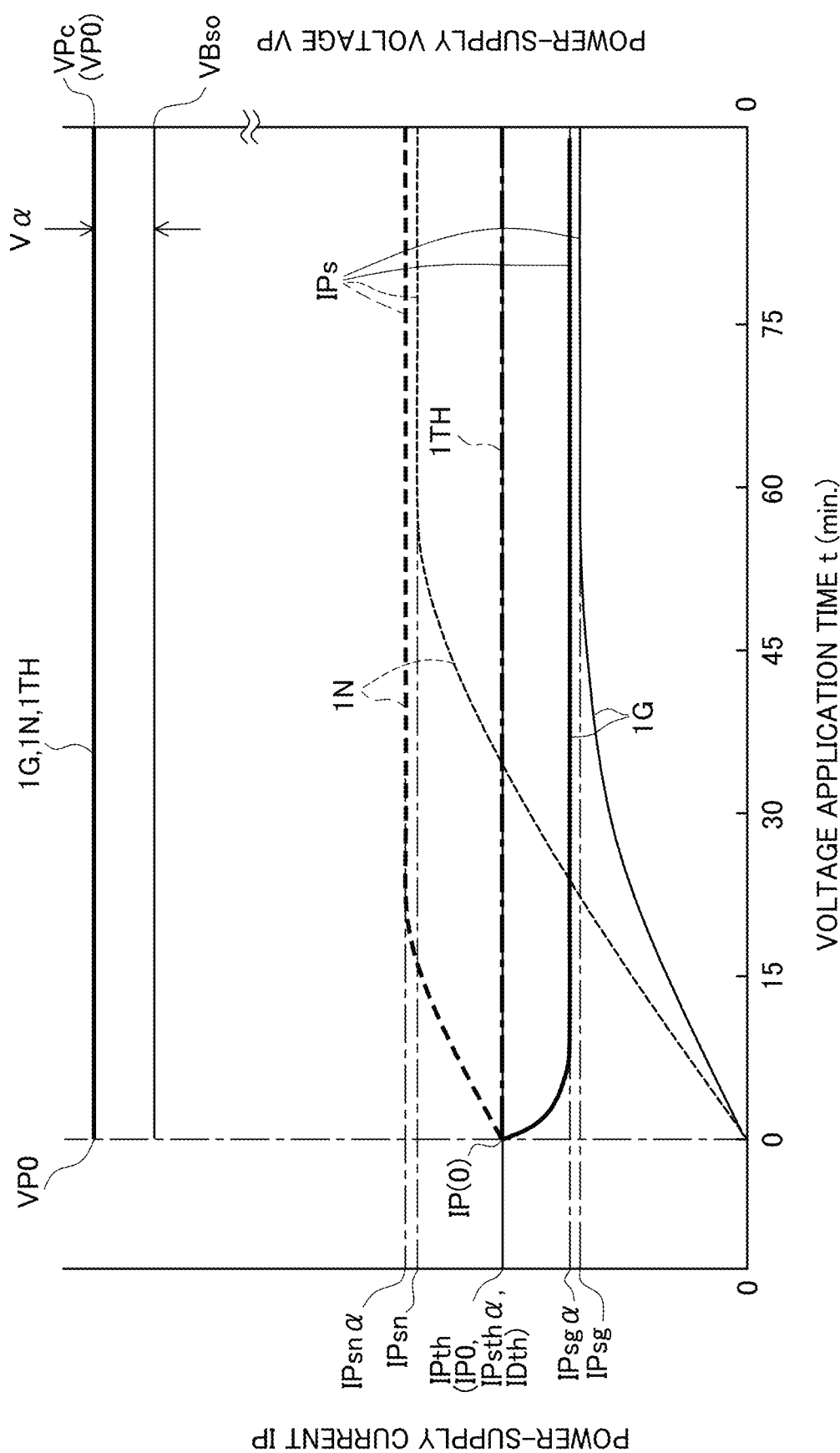
FIG. 5 is a graph schematically showing temporal changes in power-supply voltage and power-supply current with respect to a voltage application time in each of non-defective batteries and defective batteries in the first modified embodiment and the reference embodiment.

Meanwhile, if the battery 1 under inspection is the defective battery 1N, as indicated by a thick broken line in the lower graph in FIG. 5, the power-supply current IP (IP(0)) having the threshold current value IPth flows in the beginning of the voltage continuous application step S7 (the voltage application time t=0), as with the threshold battery 1TH. After that, however, the power-supply current IP gradually increases and becomes stable at a stabilized power-supply current value IPsnα slightly higher (by an amount corresponding to the difference voltage $V\alpha$) than the stabilized power-supply current value IPsn of the defective battery 1N in the reference embodiment shown by the thin broken line.

In contrast, if the inspected battery 1 is the non-defective battery 1G, as indicated by a thick solid line in the lower graph in FIG. 5, the power-supply current IP (IP(0)) having the threshold current value IPth flows in the beginning of the voltage continuous application step S7 (the voltage application time t=0), as with the threshold battery 1TH and the defective battery 1N. After that, however, the power-supply current IP sharply decreases and becomes stable at the stabilized power-supply current value IPsg$\alpha$ slightly higher than the stabilized power-supply current value IPsg of the non-defective battery 1G in the reference embodiment.

In the first modified embodiment, the reason why the power-supply current IP flowing to the non-defective battery 1G sharply decreases in the beginning of the voltage continuous application step S7 is as below. The non-defective battery 1G has a larger short-circuit resistance Rp and a smaller self-discharge current ID as compared with the threshold battery 1TH as described above, so that the stabilized power-supply current value IPsg$\alpha$ is also smaller than the stabilized power-supply current IPsth$\alpha$ of the threshold battery 1TH (=the threshold current value IPth). If an attempt is made to cause a power-supply current IP having a magnitude of the threshold current value IPth to flow in the beginning of the voltage continuous application step S7, a part of the power-supply current IP flowing to the non-defective battery 1G flows in the battery component 1B without flowing in the short-circuit resistance Rp, thus charging the battery component 1B. The series resistance of three resistances, i.e., the series resistance Rs, the contact resistance R12, and the wiring resistance Rw, are sufficiently lower than the short-circuit resistance Rp. Thus, the battery component 1B is quickly charged, increasing the battery component voltage VBB. Concurrently, the power-supply current IP supplied from the external power supply EP1 sharply decreases. However, the self-discharge current ID that has slightly increased according to the increased battery component voltage VBB flows. Thus, when the power-supply current IP decreases until becoming equal to the stabilized power-supply current value IPsg$\alpha$ corresponding to the increased self-discharge current ID, the power-supply current IP stabilizes thereat.

Specifically, the non-defective battery 1G and the defective battery 1N are opposite in the direction of change in the power-supply current IP after the start of the voltage continuous application step S7. Even in the first modified embodiment, accordingly, in the determination step S10, it is possible to determine the self-discharge state of the battery 1 by use of the power-supply current value IP(n) obtained after the start of the voltage continuous application step S7 (the voltage application time t=0). To be specific, as easily understood by comparison between the thick solid line and the thick broken line in the lower graph in FIG. 5, after the start of the voltage continuous application step S7, it is determined whether the voltage application time t elapses over a predetermined time (e.g., t=5 minutes) in the continuation judgement step S9. If the predetermined time elapses (Yes), the process goes to the determination step S10. In the determination step S10, the direction of change in the power-supply current IP over several minutes is determined using the power-supply current value IP(n). The battery 1 in which the power-supply current IP initially having the threshold current value IPth decreases with the lapse of the voltage application time t is determined to be a non-defective battery 1G. In contrast, when the battery 1 is not determined to be a non-defective battery 1G because for example the power-supply current IP has increased with the lapse of voltage application time t, this battery 1 is determined to be a defective battery 1N. Consequently, according to the method of the first modified embodiment, the quality of the battery 1 can be determined extremely quickly as compared with the first embodiment as well as the conventional method.

Other determination methods are also adoptable. Specifically, in the determination step S10, using the power-supply current value IP(n), a battery 1 having a smaller average value of power-supply current values IP(n) from the start of the voltage continuous application step S7 to the time when a predetermined voltage application time t elapses (e.g., when a voltage application time t of 5 minutes has passed) or a smaller average value of power-supply current values IP(n) for a predetermined period (e.g., a voltage application time of 4 to 5 minutes) than the threshold current value IPth is determined to be a non-defective battery 1G. In contrast, when the battery 1 is not determined to be a non-defective battery 1G because the average value of the power-supply current values IP(n) is larger than the threshold current value IPth or other reasons, the battery 1 may be determined to be a defective battery 1N. In this case, the quality of the battery 1 can be determined very quickly as compared with the first embodiment.

As an alternative, as in the first embodiment, in the continuation judgement step S9, it may be determined whether the power-supply current value IP(n) has stabilized by use of a moving average value of the power-supply current values IP(n) and so on. If Yes in the continuation judgement step S9, the process goes to the determination step S10 in which the average terminal power-supply current value IPE is calculated in the determination step S10. By comparison of this calculated value IPE with the threshold current value IPth, the battery 1 having a smaller average terminal power-supply current value IPE than the threshold current value IPth (IPE<IPth) is determined to be a non-defective battery 1G. In this case, the quality of the battery 1 also can be determined extremely quickly as compared with the first embodiment.

According to the inspection method in the first modified embodiment, the tendency of change in the power-supply current IP is reversed depending on whether the battery 1 is a non-defective battery 1G or a defective battery 1N. Therefore, after the start of the voltage continuous application step S7, whether the power-supply current IP has decreased or increased from the threshold current value IPth or whether the power-supply current IP tends to decrease or tends to increase is simply detected without waiting for the power-supply current IP to stabilize. This makes it possible to easily determine whether the battery 1 under inspection is a non-defective battery 1G having a smaller self-discharge current ID than the threshold current value IPth (=IDth) or a defective battery 1N. Thus, earlier determination is further enabled.

Second Modified Embodiment

Figure 6:
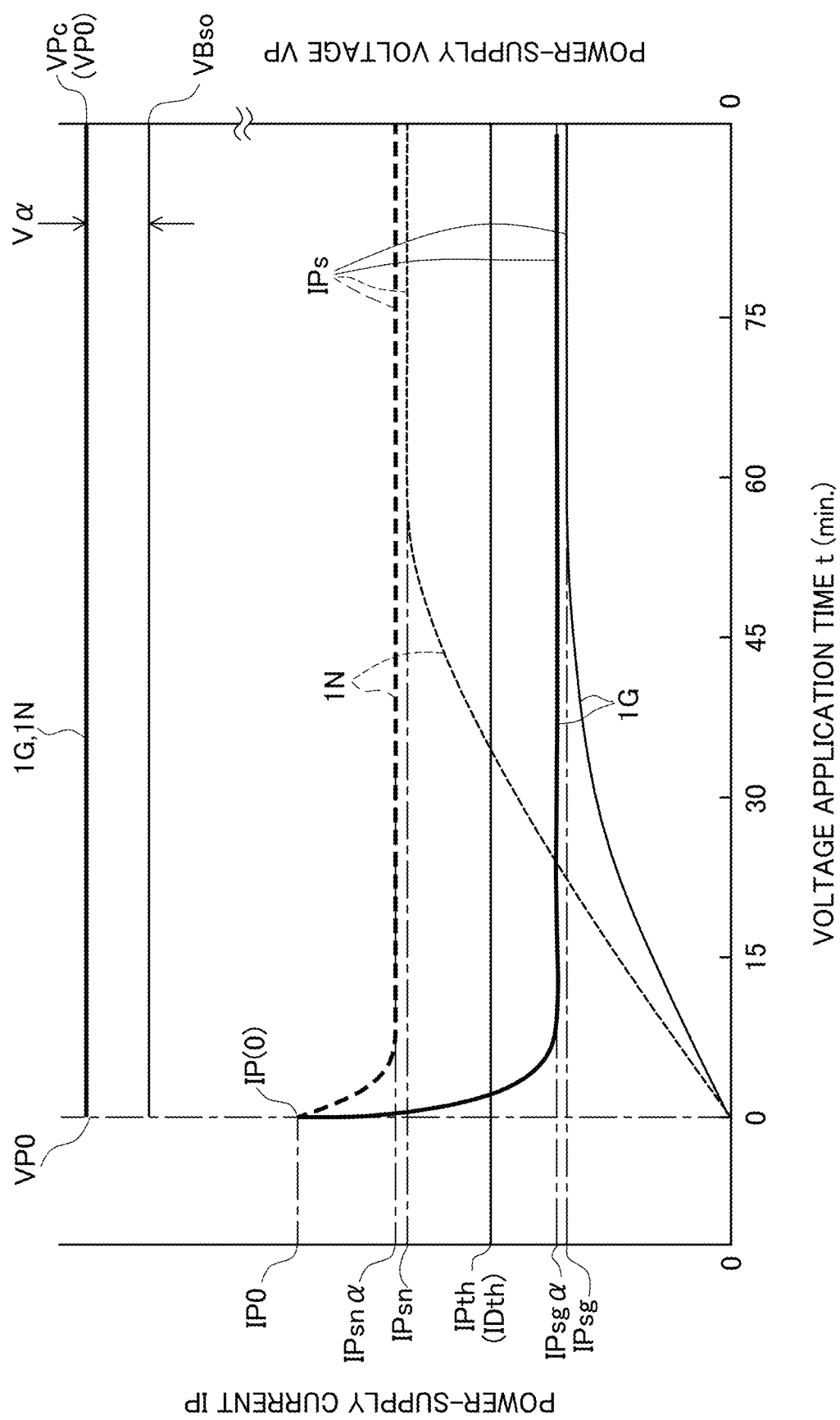
FIG. 6 is a graph schematically showing temporal changes in power-supply voltage and power-supply current with respect to a voltage application time in each of non-defective batteries and defective batteries in the second modified embodiment and the reference embodiment.
Figure 7:
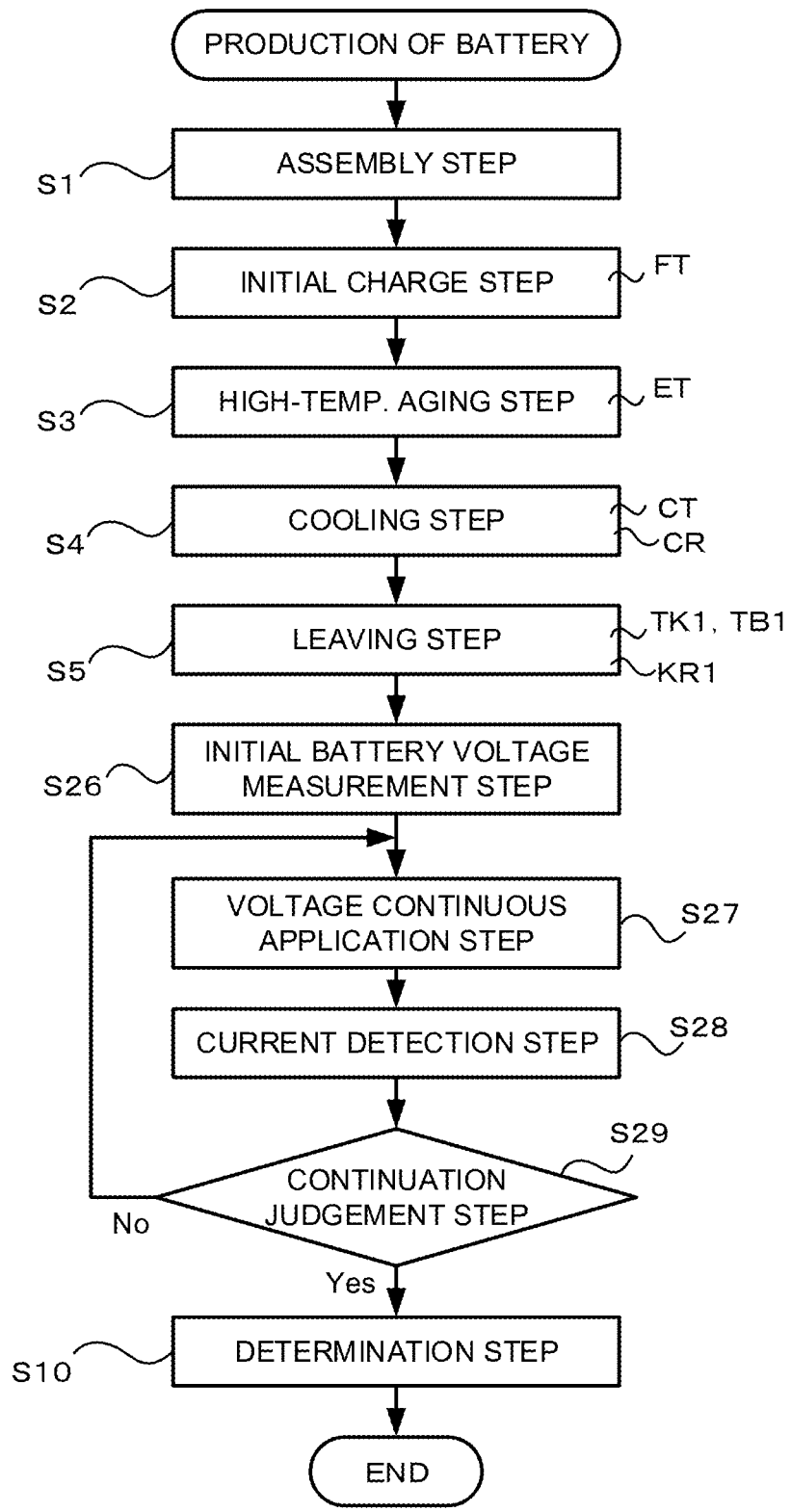
FIG. 7 is a flowchart of a process of producing a battery, including a battery self-discharge inspection process in the second embodiment.

In a second modified embodiment, even though it is a similar manner to in the first embodiment and the first modified embodiment, the initial current value IP0 of the power-supply current IP to be supplied to the battery 1 in the initial constant current supplying step S6 is set to be larger than the threshold current value IPth (e.g., IP0=35 µA>IPth=20 µA). In this modified embodiment, furthermore, the initial current value IP0 is set larger than the typical stabilized power-supply current value IPsnα of the defective battery 1N (e.g., the typical value IPsnα is assumed to be 27 μA) (IP0=35 μA>IPsnα=27 μA). This second modified embodiment will be described below mainly referring to FIGS. 3 and 6.

Herein, behaviors of the non-defective battery 1G and the defective battery 1N in the initial constant current supplying step S6 and the voltage continuous application step S7 are examined.

When the inspected battery 1 is a non-defective battery 1G, this battery 1 behaves in a similar way to that in the first modified embodiment. Specifically, when the power-supply current IP having the initial current value IP0 (=35 μA) is supplied in the initial constant current supplying step S6, an initial power-supply voltage value VP0 is generated in the external power supply EP1. In the voltage continuous application step S7, therefore, as indicated by a thick solid line in an upper graph in FIG. 6, a continuous power-supply voltage VPc equal in magnitude to this initial power-supply voltage value VP0 is continuously applied. Then, as indicated by a thick solid line in a lower graph in FIG. 6, a power-supply current IP (IP(0)) having a large initial current value IP0 flows in the beginning of the voltage continuous application step S7 (the voltage application time t=0). After that, however, the power-supply current IP sharply decreases and stabilizes at a stabilized power-supply current value IPsgα slightly higher than the stabilized power-supply current value IPsg of the non-defective battery 1G in the reference embodiment.

In contrast, even when the inspected battery 1 is the defective battery 1N, as in the case where the battery 1 is the non-defective battery 1G, the power-supply current IP sharply decreases in the beginning of the voltage continuous application step S7. In other words, when the power-supply current IP having the initial current value IP0 (=37 μA) is supplied in the initial constant current supplying step S6, a power-supply voltage VP having a magnitude of the initial power-supply voltage value VP0 is also generated in the external power supply EP1. In the voltage continuous application step S7, the continuous power-supply voltage VPc having the magnitude of the initial power-supply voltage value VP0 is continuously applied. Then, as indicated by a thick broken line in the lower graph in FIG. 6, the power-supply current IP having the large initial current value IP0 flows in the beginning of the voltage continuous application step S7 (the voltage application time t=0). After that, however, the power-supply current IP sharply decreases and stabilizes at a stabilized power-supply current value IPsnα slightly higher than the stabilized power-supply current value IPsn of the defective battery 1N in the reference embodiment.

The reason why the power-supply current IP flowing to the non-defective battery 1G or defective battery 1N at the initial stage of the voltage continuous application step S7 in the second modified embodiment is the same as the reason of the behaviors of the non-defective battery 1 in the first modified embodiment, and thus it is not repeated herein.

Also in the second modified embodiment, therefore, in the determination step S10, it is possible to determine the self-discharge state of the battery 1 earlier than in the conventional method by using the power-supply current value IP(n) obtained after the start of the voltage continuous application step S7 (the voltage application time t=0). Specifically, in the continuation judgement step S9, as in the first embodiment, it may be determined whether the power-supply current value IP(n) has stabilized by use of a moving average value of the power-supply current values IP(n) and so on. If Yes in the continuation judgement step S9, the process goes to the determination step S10 in which the average terminal power-supply current value IPE is calculated. By comparison of this calculated value IPE with the threshold current value IPth, the battery 1 having a smaller average terminal power-supply current value IPE than the threshold current value IPth (IPE<IPth) is determined to be the non-defective battery 1G. In the second modified embodiment, consequently, the quality of the battery 1 can be determined extremely early as compared with the first embodiment.

In the inspection method of the second modified embodiment, the initial current value IP0 is set to a value larger than the threshold current value IPth, that is, larger than the threshold current value IDth (=IPth) of the self-discharge current ID set in the battery 1 (IP0>IPth=IDth). As can be easily understood from the above description referring to FIG. 6, in a battery 1 having a magnitude (IPsg, IPsn) of a stabilized power-supply current IPs smaller than the initial current value IP, that is, a non-defective battery 1G, and, in a defective battery 1N that has a stabilized power-supply current IPsn smaller than the initial current value IP0, the magnitude of the power-supply current IP quickly decreases from the initial current value IP0 after the start of the voltage continuous application step S7, and stabilizes with the magnitude (IPsg, IPsn) of the stabilized power-supply current IPs of the battery 1. Thus, the quality of the battery 1 can be determined early. Since the initial current value IP0 is set to a lager value than the threshold current value IDth (=IPth) of the self-discharge current ID, the magnitude of the power-supply current IP of each battery 1 can be stabilized in extremely short time, excepting the defective battery or defective batteries 1N having a stabilized power-supply current value IPsn larger than the initial current value IP0 among defective batteries 1N. In the determination step S10, consequently, the quality of the battery 1 and others can be early determined.

In the second modified embodiment, furthermore, the initial current value IP0 is set to a larger value than a typical stabilized power-supply current value IPsnα of the defective battery 1N (IP0>IPsnα). Since the initial current value IP0 is set to a larger value than the typical stabilized value IPsnα of the defective battery 1N, the magnitude of the power-supply current IP of each battery 1 can be stabilized in extremely short time, excepting a special defective battery or defective batteries 1N having a larger stabilized power-supply current value IPsn than the typical defective battery among the defective batteries 1N. In the determination step S10, consequently, the quality of the battery 1 and others can be early determined.

Second Embodiment

In the foregoing first embodiment and first and second modified embodiments (see FIGS. 1 to 6), prior to the voltage continuous application step S7, the initial constant current supplying step S6 is provided in which the power-supply current IP which is a constant current having a predetermined initial current value IP0 is supplied to the battery 1 from the external power supply EP1 placed in a constant current power-supply mode selected with the switch SW. The following voltage continuous application step S7 is configured to continuously supply a continuous power-supply voltage VPc having a magnitude equal to the initial power-supply voltage VP0 generated in the external power supply EP1 when the power-supply current IP having the initial current value IP0 is supplied to the battery 1 in the initial constant current supplying step S6. Accordingly, in each of the batteries 1 different in the magnitude of the self-discharge current ID, such as a non-defective battery 1G or a defective battery 1N, the power-supply current value IP(0) of the power-supply current IP becomes the same initial current value IP0 (IP(0)=IP0) in the beginning of the voltage continuous application step S7 (the voltage application time t=0).

In contrast, in the second embodiment (see FIGS. 1, 2, and 7 to 9), prior to a voltage continuous application step S27, an initial battery voltage measurement step S26 is provided to measure a magnitude of an initial open battery voltage VBso of each battery 1. In the following voltage continuous application step S27, the continuous power-supply voltage VPc is continuously applied with a magnitude corresponding to the sum of the initial open battery voltage VBso and a predetermined incremental voltage $\Delta$VP having the same magnitude between the batteries 1 is continuously applied. The second embodiment differs in this configuration from the first embodiment. The following description is made with a focus on the differences from the first embodiment, and similar or identical parts are omitted or simply mentioned.

The battery 1 used in the second embodiment is identical to the battery 1 used in the first embodiment and others and thus will not be described in detail below. The assembly step S1 to the leaving step S5 in the method for producing the battery 1 (see FIG. 7) are the same as those in the first embodiment, and their details are not repeated herein.

Figure 8:
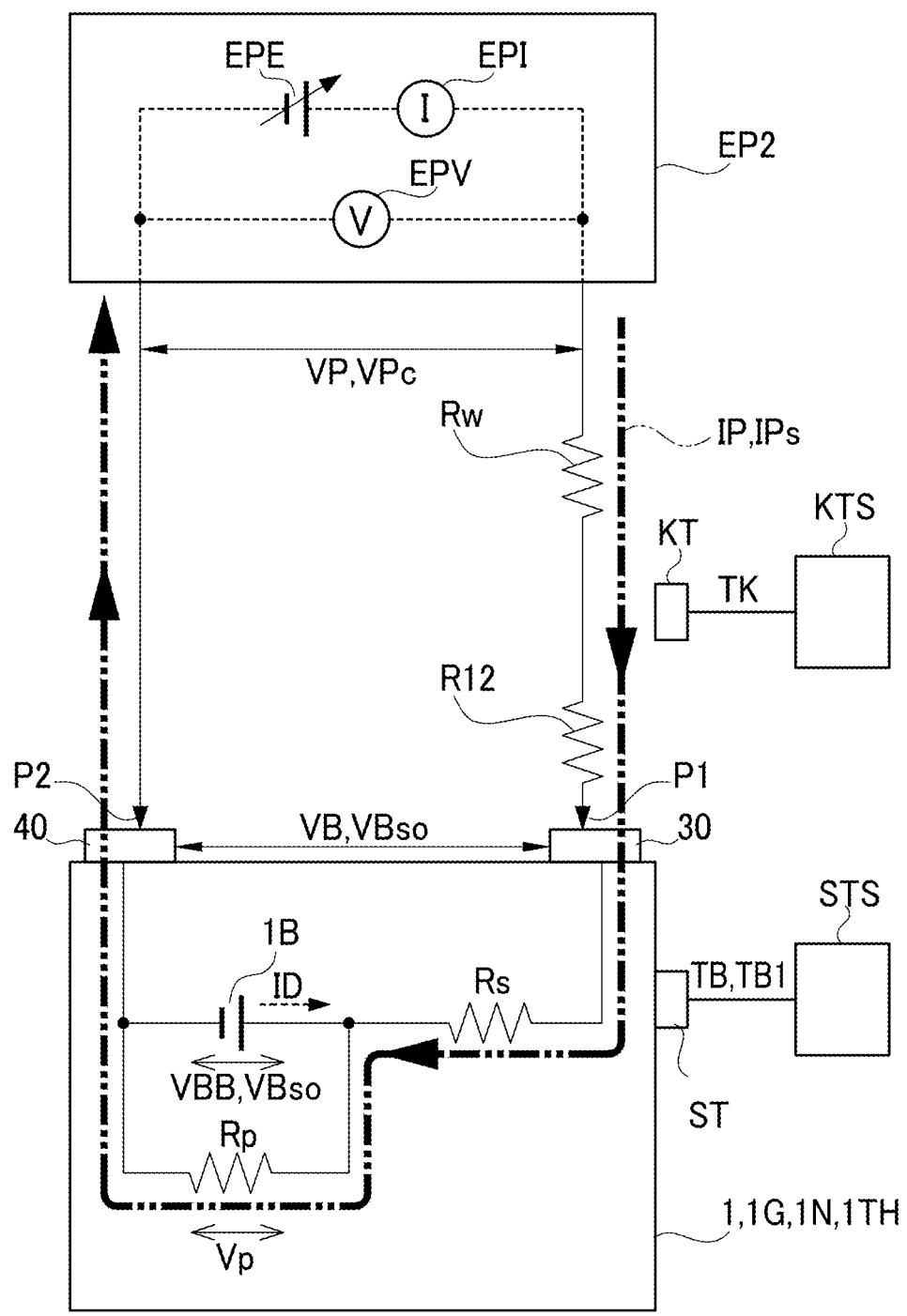
FIG. 8 is a circuit diagram related to the self-discharge inspection method for the battery in the second embodiment, showing a state that an external power supply is connected to the battery.

In the second embodiment, in the initial battery voltage measurement step S26 following the leaving step S5, the initial open battery voltage VBso, which is an open voltage of the battery 1 at the first battery temperature TB1 (TB1=20.0° C.) is measured. Specifically, as shown in FIG. 8, a pair of probes P1 and P2 of an external power supply EP2 are respectively brought into contact with the positive terminal member 30 and the negative terminal member 40 to connect the external power supply EP2 to the battery 1. The power-supply current IP flowing from the external power supply EP2 to the battery 1 is set to zero (IP=0). Then, the initial open battery voltage VBso of the battery 1 is measured with a voltmeter EPV (see FIG. 8). In the second embodiment, the batteries 1 are also assumed to have the same initial open battery voltage VBso for easy consideration, as described above.

The external power supply EP2 used in the second embodiment shown in FIG. 8 is a precision DC power supply capable of variably and precisely controlling a power-supply voltage VS generated in a DC voltage supply EPE and includes the voltmeter EPV and the ammeter EPI as in the first embodiment and others. However, unlike the external power supply EP1 used in the first embodiment and others, the external power supply EP2 is a variable constant voltage power supply including neither the DC constant current supply EPC nor the switch SW.

However, as in the first embodiment, the ambient temperature TK around the battery 1 is detected by the temperature detecting device KTS including the temperature sensor KT. Further, the battery temperature TB of the battery 1 is detected by the temperature detecting device STS including the temperature sensor ST. Also in the second embodiment, while the probe P1 remains in contact with the positive terminal member 30 and the probe P2 remains in contact with the negative terminal member 40, the initial battery voltage measurement step S26, the voltage continuous application step S27, a current detection step S28, and a continuation judgement step S29 mentioned later are performed.

The battery component voltage VBB corresponds to a battery voltage VB when the power-supply current IP is zero (IP=0). Since the initial open battery voltage VBso is only measured in the initial battery voltage measurement step S26, the battery component voltage VBB generated in the battery component 1B in the beginning of the following voltage continuous application step S27 (the voltage application time t=0) is equal to the initial open battery voltage VBso (VBB=VBso, t=0).

Figure 9:
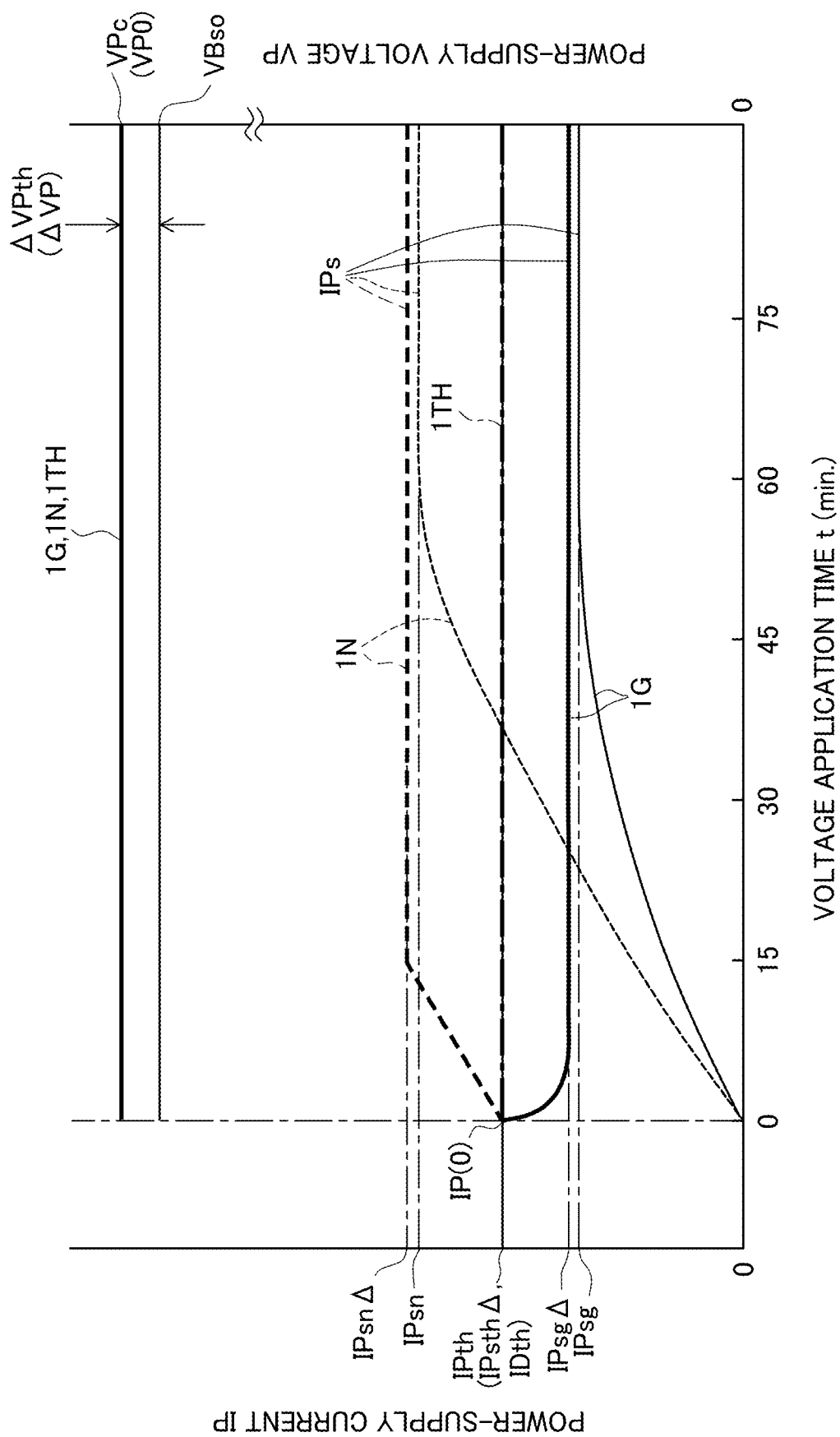
FIG. 9 is a graph schematically showing temporal changes in power-supply voltage and power-supply current with respect to a voltage application time in each of non-defective batteries and defective batteries in the second embodiment and the reference embodiment.

In the voltage continuous application step S27, under the first ambient temperature TK1, as shown in an upper graph in FIG. 9, a continuous power-supply voltage VPc is generated with a magnitude corresponding to the sum of the initial open battery voltage VBso obtained in the initial battery voltage measurement step S26 and the predetermined incremental voltage $\Delta$VP (VPc=VBso+$\Delta$VP), and this continuous power-supply voltage VPc is started to be applied to the battery 1 having the first battery temperature TB1 (the voltage application time t=0). After that, the continuous power-supply voltage VPc continues to be applied. Specifically, the continuous power-supply voltage VPc generated in the external power supply EP2 is maintained at the same magnitude. Therefore, unlike the conventional art in which the continuous power-supply voltage VPc is set equal to the initial open battery voltage VBso (VPc=VBso), the power-supply current IP flows to the battery 1 from the beginning of the voltage continuous application step S27 (IP(0)>0).

In determining the magnitude of the incremental voltage $\Delta$VP to be added to the initial open battery voltage VBso, it may be appropriately set in consideration of the magnitude of the power-supply current IP (the power-supply current value IP(0)) that flows to each battery 1 in the beginning of the voltage continuous application step S27. For example, the magnitude of the incremental voltage $\Delta$VP can be determined so that the power-supply current value IP(0) in the voltage continuous application step S27 is (i) a smaller value than the stabilized power-supply current value IPsg$\Delta$ corresponding to the self-discharge current ID of the typical non-defective battery 1G (IP(0)<IPsg$\Delta$), (ii) a value equal to the stabilized power-supply current value IPsg$\Delta$ (IP(0)= IPsg$\Delta$), (iii) a value equal to the threshold current value IDth of the threshold battery 1TH (IP(0)=IDth), (iv) a value equal to the stabilized power-supply current value IPsn$\Delta$ corresponding to the self-discharge current ID of the typical defective battery 1N (IP(0)=IPsv$\Delta$), or (v) a value larger than the stabilized power-supply current value IPsn$\Delta$ (IP(0)> IPsn$\Delta$).

In the second embodiment (see FIGS. 7 to 9), therefore, the incremental voltage $\Delta$VP is set to a threshold incremental voltage $\Delta$VPth with which the power-supply current value IP(0) of the power-supply current IP flowing to the battery 1 becomes the threshold current value IPth equal to the threshold current value IDth of the self-discharge current ID allowable in each battery 1 in the beginning of the voltage continuous application step S27 (the voltage application time t=0). Then, the behaviors of each of the batteries 1 (the non-defective battery 1G, the defective battery 1N, and the threshold battery 1TH) after the start of the voltage continuous application step S27 (see FIG. 9) are similar to those in the above-described first modified embodiment (see FIG. 5).

Specifically, in the voltage continuous application step S27, as indicated by a thick solid line in the upper graph in FIG. 9, the continuous power-supply voltage VPc having a magnitude corresponding to the sum of the measured initial open battery voltage VBso and the threshold incremental voltage ΔVPth is continuously applied. Then, in the beginning of the voltage continuous application step S27 (the voltage application time t=0), the power-supply current IP having the power-supply current value IP(0) equal to the threshold current value IPth (IP(0)=IPth) flows to each battery 1.

Herein, when the inspected battery 1 is the threshold battery 1TH, the power-supply current value IP(0) of the power-supply current IP is equal in magnitude to the self-discharge current ID of the threshold battery 1TH (the threshold current value IDth). Thus, as indicated by a thick dashed-dot line in a lower graph in FIG. 9, the power-supply current IP is stable from an early stage of the voltage continuous application step S27 and, even after a lapse of the voltage application time t, the power-supply current IP remains equal to the threshold current value IPth.

Meanwhile, even when the inspected battery 1 is a defective battery 1N, as indicated by a thick broken line in the lower graph in FIG. 9, the power-supply current IP (IP(0)) having the threshold current value IPth also flows in the beginning of the voltage continuous application step S27 (the voltage application time t=0). After that, however, the power-supply current IP gradually increases and stabilizes at a slightly higher stabilized power-supply current value IPsnΔ than the stabilized power-supply current value IPsn of the defective battery 1N in the reference embodiment indicated by a thin broken line.

In contrast, even when the battery 1 is a non-defective battery 1G, as indicated by a thick solid line in the lower graph in FIG. 9, the power-supply current IP (IP(0)) having the threshold current value IPth also flows in the beginning of the voltage continuous application step S27 (the voltage application time t=0), as in the threshold battery 1TH and the defective battery 1N. After that, however, the power-supply current IP rapidly decreases and stabilizes at a stabilized power-supply current value IPsgΔ slightly higher than the stabilized power-supply current value IPsg of the non-defective battery 1G in the reference embodiment.

Therefore, also in the second embodiment, using the same method as that in the first modified embodiment, the self-discharge state of the battery 1 can be determined in the determination step S10 by use of the power-supply current value IP(n) obtained after the start of the voltage continuous application step S27 (the voltage application time t=0). According to the method in the second embodiment, consequently, the quality of the battery 1 can be determined extremely quickly as compared with the conventional method.

As described above, the method of the second embodiment can also quickly stabilize the power-supply current IP flowing to the battery 1 to be inspected and more quickly perform the self-discharge inspection than the conventional inspection method. Furthermore, the method for producing the battery 1 in the second embodiment can produce the battery 1 by appropriately inspecting the presence or absence of a short circuit and the degree of the same in short time in the initial stage of the battery 1.

In the inspection method in the second embodiment, each battery 1 to be inspected is applied with the continuous power-supply voltage VPc having a magnitude corresponding to the sum of the initial open battery voltage VBso and the same incremental voltage ΔVP. Thus, the voltage continuous application step S27 can be performed on the batteries 1 under the uniform condition. In addition, according to this inspection method, the inspection can be performed without using the constant current mode or by using the external power supply EP2 that does not have the constant current mode.

In addition, according to the inspection method in the second embodiment, the tendency of change differs depending on whether the battery 1 is a non-defective battery 1G or a defective battery 1N. Therefore, after the start of the voltage continuous application step S7, whether the power-supply current IP has decreased or increased from the threshold current value IPth or whether the power-supply current IP has a decreasing tendency or an increasing tendency is simply detected without waiting for the power-supply current IP to stabilize. This makes it possible to easily determine whether the battery 1 under inspection is a non-defective battery 1G having a smaller self-discharge current ID than the threshold current value IPth (=IDth) or a defective battery 1N. Thus, earlier determination is further enabled.

The present disclosure is described as above in the first and second embodiments and first and second modified embodiments, but is not limited to those embodiments. The present disclosure may be embodied in other specific forms without departing from the essential characteristics thereof.

For instance, in the first and second embodiments and first and second modified embodiments, in the process of producing the battery 1, the inspection step of inspecting self-discharge of the battery 1 is performed as shown in the initial constant current supplying step S6 to the determination step S10 or the initial battery voltage measurement step S26 to the determination step S10. As an alternative, those inspection steps in the self-discharge inspection can be applied to a used battery 1 that has been already placed on the market and used.

Further, in the first and second embodiments and first and second modified embodiments, the quality of the battery 1 is determined by use of the threshold current value IPth. As an alternative, the battery 1 may be classified into three or more ranks by use of a plurality of different threshold current values.

REFERENCE SIGNS LIST 1 (Charged) Battery (Power storage device)
S2 Initial charge step
S5 Leaving step
S6 Initial constant current supplying step (Inspection step)
S26 Initial battery voltage measurement step (First device voltage measurement step, Inspection step)
S7, S27 Voltage continuous application step (Inspection step)
S8, S28 Current detection step (Inspection step)
S9, S29 Continuation judgement step (Inspection step)
t Voltage application time
S10 Determination step (Inspection step)
TB Battery temperature (Device temperature)
TB1 First battery temperature (First device temperature)
VB Battery voltage (Device voltage)
VBso Initial open battery voltage (First device voltage)
Vα Difference voltage
EP1, EP2 External power supply
VP Power-supply voltage (of External power supply)
ΔVP Incremental voltage
ΔVPth Threshold incremental voltage
VP0 Initial power-supply voltage value
VPc Continuous power-supply voltage
IP Power-supply current
IP0 Initial current value IP(n) (Obtained) Power-supply current value
IPs Stabilized power-supply current
IPth Threshold current value (of Power-supply current)
1B Battery component
VBB Battery component voltage (generated in Battery component)
Rs Series resistance (of Battery)
Rp Short-circuit resistance (of Battery)
ID Self-discharge current
IDth Threshold current value (of Self-discharge current)

What is claimed is:

1. A method for inspecting self-discharge of a power storage device, the method comprising:
 a) continuously applying a continuous power-supply voltage from an external power supply to the power storage device that has been charged in advance to a first device voltage, the continuous power-supply voltage being higher than the first device voltage and having a constant magnitude;
 b) detecting a power-supply current flowing from the external power supply to the power storage device; and
 c) determining a self-discharge state of the power storage device based on the detected power-supply current.

2. The method for inspecting self-discharge of a power storage device according to claim 1, wherein
 the method further includes:
  prior to the continuously applying a) of the continuous power-supply voltage,
  d) supplying a constant current having a predetermined initial current value from the external power supply placed in a constant current supply mode to the power storage device, and
 the continuously applying a) of the continuous power-supply voltage following the supplying d) of the constant current is configured to:
  e) continuously apply the continuous power-supply voltage having a magnitude equal to an initial power-supply voltage generated in the external power supply when the constant current having the initial current value is supplied to the power storage device in the supplying d).

3. The method for inspecting self-discharge of a power storage device according to claim 2, wherein the initial current value is set to be equal in magnitude to a threshold current value of a self-discharge current set in the power storage device.

4. The method for inspecting self-discharge of a power storage device according to claim 1, wherein
 the method further includes:
  prior to the continuously applying a) of the continuous power-supply voltage,
  f) measuring a magnitude of the first device voltage of the power storage device, and
 the continuously applying a) of the continuous power-supply voltage following the measuring f) configured to:
  g) continuously apply the continuous power-supply voltage having a magnitude corresponding to a sum of the first device voltage and a predetermined incremental voltage.

5. The method for inspecting self-discharge of a power storage device according to claim 4, wherein
 in a beginning of the continuous application g) of the continuous power-supply voltage,
 the incremental voltage is set to a magnitude of a threshold incremental voltage that supplies a power-supply current equal in magnitude to a threshold current value of a self-discharge current allowable in the power storage device.

6. A method for producing a power storage device, the method comprising:
 h) initially charging an assembled and uncharged power storage device to a predetermined charged state to provide a previously charged power storage device; and
 i) inspecting a self-discharge state of the previously charged power storage device by the self-discharge inspection method for the power storage device according to claim 1.

7. A method for producing a power storage device, the method comprising:
 h) initially charging an assembled and uncharged power storage device to a predetermined charged state to provide a previously charged power storage device; and
 i) inspecting a self-discharge state of the previously charged power storage device by the self-discharge inspection method for the power storage device according to claim 2.

8. A method for producing a power storage device, the method comprising:
 h) initially charging an assembled and uncharged power storage device to a predetermined charged state to provide a previously charged power storage device; and
 i) inspecting a self-discharge state of the previously charged power storage device by the self-discharge inspection method for the power storage device according to claim 3.

9. A method for producing a power storage device, the method comprising:
 h) initially charging an assembled and uncharged power storage device to a predetermined charged state to provide a previously charged power storage device; and
 i) inspecting a self-discharge state of the previously charged power storage device by the self-discharge inspection method for the power storage device according to claim 4.

10. A method for producing a power storage device, the method comprising:
 h) initially charging an assembled and uncharged power storage device to a predetermined charged state to provide a previously charged power storage device; and
 i) inspecting a self-discharge state of the previously charged power storage device by the self-discharge inspection method for the power storage device according to claim 5.

* * * * *